US 7,122,900 B2
(45) Date of Patent: Oct. 17, 2006

(12) United States Patent
Takeda et al.

(54) SEMICONDUCTOR DEVICE AND METHOD MANUFACTURING THE SAME

(75) Inventors: Kenichi Takeda, Atlanta, GA (US); Daisuke Ryuzaki, Kokubunji (JP); Kenji Hinode, Tsukuba (JP); Toshiyuki Mine, Fussa (JP)

(73) Assignee: Renesas Technology Corp., Chiyoda-ku (JP)

( * ) Notice: Subject to any disclaimer, the term of this patent is extended or adjusted under 35 U.S.C. 154(b) by 64 days.

(21) Appl. No.: 10/276,776

(22) PCT Filed: May 28, 2001

(86) PCT No.: PCT/JP01/04451

§ 371 (c)(1), (2), (4) Date: Nov. 19, 2002

(87) PCT Pub. No.: WO02/01627

PCT Pub. Date: Jan. 3, 2002

(65) Prior Publication Data
US 2003/0111730 A1 Jun. 19, 2003

(30) Foreign Application Priority Data
Jun. 26, 2000 (JP) ............................. 2000-196256

(51) Int. Cl.
H01L 21/44 (2006.01)

(52) U.S. Cl. .................... 257/758; 257/759; 257/760; 427/387

(58) Field of Classification Search ................ 257/758, 257/759, 760
See application file for complete search history.

(56) References Cited

U.S. PATENT DOCUMENTS 5,075,061 A * 12/1991 Howell .................. 264/173.16

(Continued)

FOREIGN PATENT DOCUMENTS

JP          63-76455          9/1986

(Continued)

OTHER PUBLICATIONS

B. Luther et al., "Planar Copper-Polyimide Back End of the Line Interconnections for ULSI Devices," Proceedings of 1993 Multilevel Interconnection Conference (Jun. 8-9, 1993), pp. 15-21.

(Continued)

Primary Examiner—Laura M. Schillinger
(74) Attorney, Agent, or Firm—Reed Smith LLP; Stanley P. Fisher, Esq.; Juan Carlos A. Marquez, Esq.

(57) ABSTRACT

A semiconductor device according to this invention comprises a substrate 100 in which semiconductor elements are formed, a first conductor 301 at least a portion of the peripheral surface of which is made of a material comprising copper as a main ingredient, and a first insulative diffusion barrier layer 203 covering at least a portion of the first conductor 301. The first insulative diffusion barrier layer 203 is formed by using a gas mixture at least containing an alkoxy silane represented by the general formula $(RO)_n SiH_{4-n}$ (n is an integer in a range from 1 to 3, R represents an alkyl group, an aryl group or a derivative thereof), and an oxidative gas by a plasma CVD. Thus, a semiconductor device comprising copper wiring of high reliability and with less wiring delay time can be provided.

3 Claims, 16 Drawing Sheets

U.S. PATENT DOCUMENTS

| | | | | |
|---|---|---|---|---|
| 5,326,643 | A * | 7/1994 | Adamopoulos et al. | 428/472.2 |
| 5,397,863 | A * | 3/1995 | Afzali-Ardakani et al. | 174/258 |
| 5,556,899 | A * | 9/1996 | Afzali-Ardakani et al. | 523/215 |
| 5,599,582 | A * | 2/1997 | Adamopoulos et al. | 427/207.1 |
| 5,612,254 | A * | 3/1997 | Mu et al. | 438/653 |
| 6,159,322 | A * | 12/2000 | Ogata et al. | 156/230 |
| 6,420,276 | B1 * | 7/2002 | Oku et al. | 438/758 |
| 6,479,374 | B1 * | 11/2002 | Ioka et al. | 438/601 |
| 6,500,752 | B1 * | 12/2002 | Oku et al. | 438/622 |
| 6,509,279 | B1 * | 1/2003 | Fujii et al. | 438/778 |
| 6,723,631 | B1 * | 4/2004 | Noguchi et al. | 438/618 |
| 6,730,594 | B1 * | 5/2004 | Noguchi et al. | 438/653 |
| 6,808,972 | B1 * | 10/2004 | Sirringhaus et al. | 438/200 |
| 6,824,833 | B1 * | 11/2004 | Nishikawa et al. | 427/387 |
| 7,018,678 | B1 * | 3/2006 | Gronbeck et al. | 427/387 |
| 2003/0111730 | A1 * | 6/2003 | Takeda et al. | 257/758 |

FOREIGN PATENT DOCUMENTS

| | | | |
|---|---|---|---|
| JP | 7-211712 | | 1/1994 |
| JP | 11-87332 | | 9/1997 |
| JP | 2000-3913 | | 3/1999 |
| JP | 11-330246 | | 4/1999 |
| JP | 2000-82741 | | 8/1999 |
| JP | 2003142579 | A * | 5/2003 |

OTHER PUBLICATIONS

Ping Xu et al., BLOk™—A low-K dielectric Bbarrier/Etch Stop Film for Copper Damascene Applications, Proceedings of 1999 International Interconnection Technology Conference, IITC 99-109-ITC-99-111.

M. Vogt et al., "Barrier Behaviour of Plasma Deposited Silicon Oxide and Nitride Against Cu Diffusion," Applied Surface Science 91 (1995), pp. 303-307.

Alvin L.S. Loke et al., "Kinetics of Copper Drift in PECVD Dielectrics," IEEE Electron Device Letters, vol. 17, No. 12 Dec. 1996), pp. 549-551.

* cited by examiner

FIG. 4

|  | P-TMS | P-SiN | BLOk | P-TEOS |
|---|---|---|---|---|
| PARASITIC CAPACITANCE (RELATIVE VALUE) | SMALL (100%) | LARGE (109%) | SMALL (103%) | SMALL (101%) |
| LEAK CURRENT (RELATIVE VALUE) | SMALL (100%) | SMALL (110%) | LARGE (150%) | SMALL (100%) |
| DIELECTRIC BREAKDOWN LIFETIME (2MV/cm) | LONG (100 YEARS OR MORE) | MEDIUM (10 YEARS OR MORE) | SHORT (10 YEARS OR LESS) | SHORT (10 YEARS OR LESS) |

FIG. 5

|  | P-TMS | P-SiN | BLOk | P-TEOS |
|---|---|---|---|---|
| SPECIFIC DIELECTRIC CONSTANT | 3.8 | 7.8 | 5.0 | 4.1 |
| LEAK CURRENT (2MV/cm) | 0.1nA/cm$^2$ | 2nA/cm$^2$ | 1$\mu$nA/cm$^2$ | 0.1nA/cm$^2$ |
| DIELECTRIC BREAKDOWN LIFETIME (2MV/cm) | 250 YEARS | 10 YEARS | 2 YEARS | 0.2 YEAR |

FIG. 14
(a)
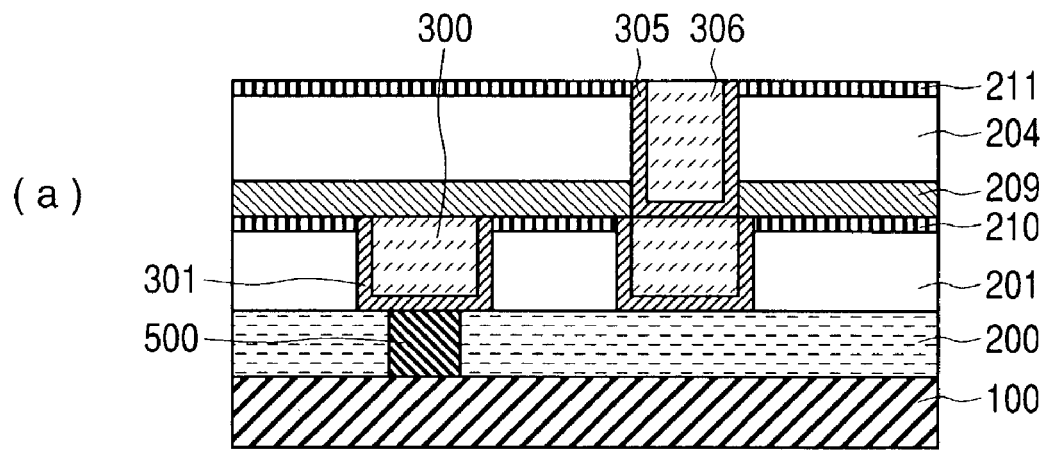
(b)
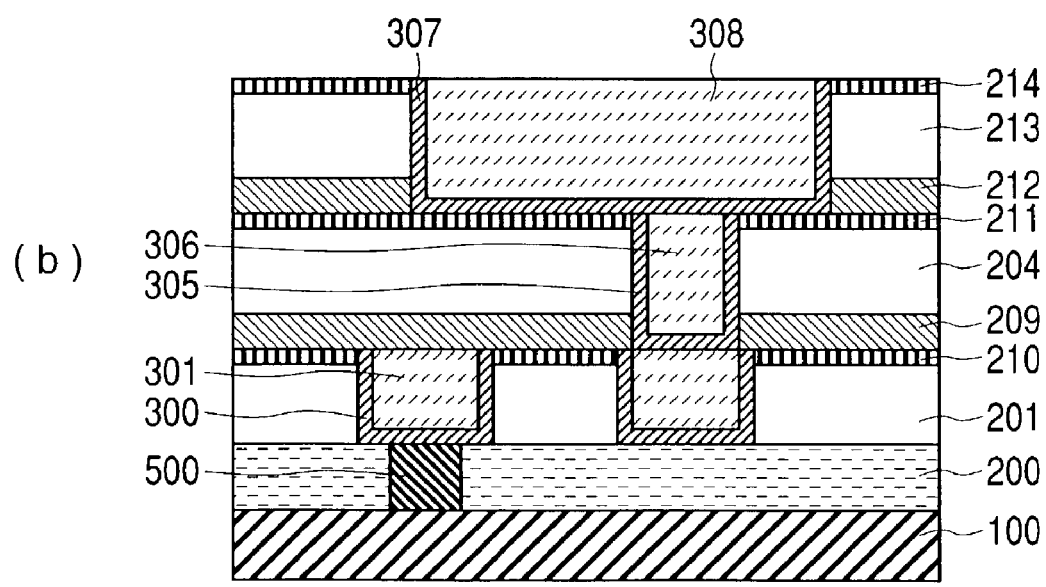

FIG. 16
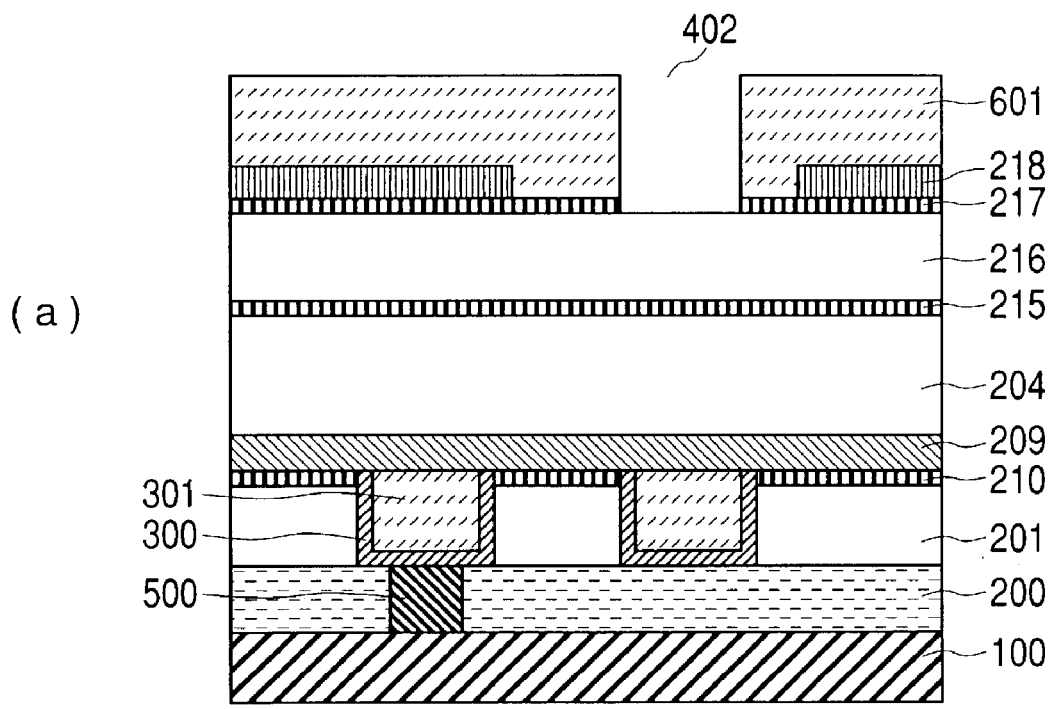
(a)
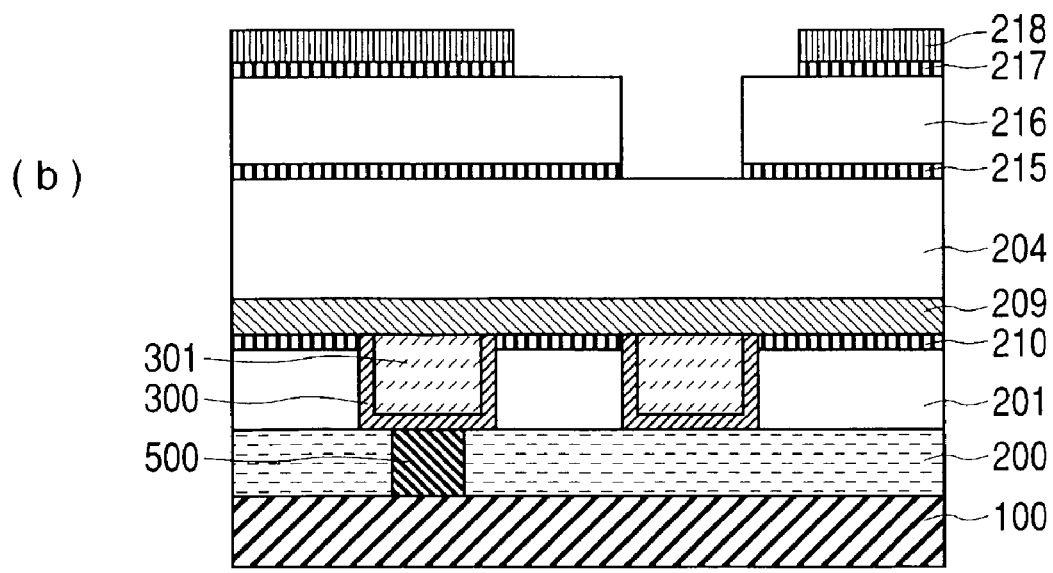
(b)

FIG. 17
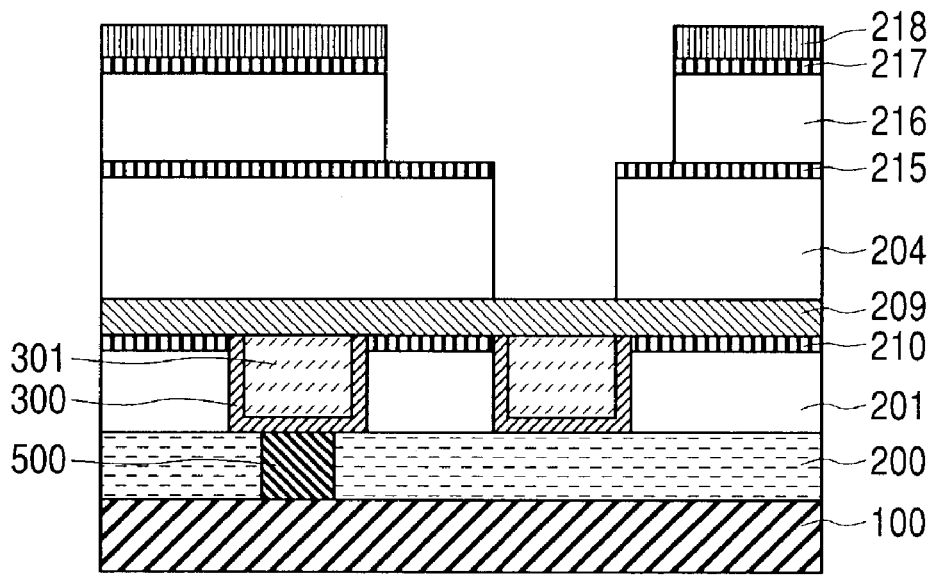
(a)
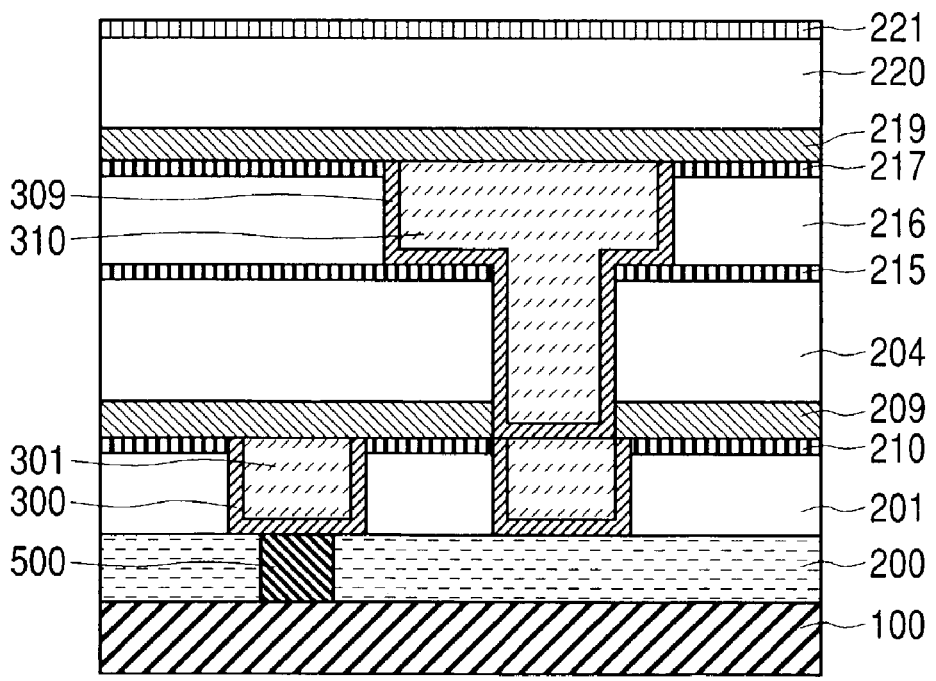
(b)

SEMICONDUCTOR DEVICE AND METHOD MANUFACTURING THE SAME

TECHNICAL FIELD

This invention relates to a semiconductor device having copper wiring of high reliability and method of manufacturing the same.

BACKGROUND ART

Heretofore, as wiring materials for LSI (Large Scaled Integrated Circuits), aluminum or an aluminum alloy has been used predominantly. However, since aluminum has a low melting point (660° C.) and is poor in migration resistance, it is difficult to cope with a higher integration degree and higher operation speed of LSI.

On the contrary, since copper has a melting point of 1083° C. which is higher than the melting point of aluminum and also has low electric resistivity (about ⅔ of aluminum as a bulk value), it is expected as LSI wiring materials for the next generation. However, implementation of copper wiring has several subjects and one of them is an improvement in the reliability of wiring insulative films. It has been known that copper diffuses easily into a dielectric film to lower the reliability (dielectric breakdown voltage) of an insulative film. A method of overcoming the problem has been disclosed in Japanese Patent Laid-open No. Sho 63-76455. In this method, diffusion of copper is prevented by disposing a metal layer as a diffusion barrier on the periphery of copper wiring. However, this method requires steps of forming a metal film as a diffusion barrier layer over the entire upper surface of copper wiring and then removing the metal film of unnecessary portions in order to prevent a short circuit between adjacent wiring. When the distance between the adjacent copper wiring is narrowed, for example, to 0.25 μm or less, it is difficult to remove the unnecessary metal film between the wiring with good accuracy but no consideration has been taken therefor.

The technique as the countermeasure is described in Proceedings of VLSI Multilevel Interconnection Conference, 1993, pp 15. This is a method of covering the upper surface of copper wiring buried in an insulative film with a silicon nitride film as a diffusion barrier layer. Since the silicon nitride film is insulative, there is no requirement for the step of removing the silicon nitride film formed between adjacent copper wiring. In addition, there is no worry of a short circuit between the wiring even when the distance between the copper wiring is narrowed. However, since the specific dielectric constant of the silicon nitride film is as high as about 8 compared with the dielectric constant of general dielectric films (about 4) used in LSI wiring steps, a parasitic capacitance between the adjacent wiring is increased and the propagation speed of electric signals is lowered, but no consideration has been taken therefor.

The technique as the countermeasure is introduced in Proceedings of the 1999 International Interconnect Technology Conference, 1999, pp 109. This is a method of using a BLOk film (BLOk is the trade name of products manufactured by Applied Materials, Inc.) comprising silicon carbide as a main ingredient by using a plasma CVD as a diffusion barrier layer for copper. Since the BLOk film is insulative like the silicon nitride layer, it is not necessary for the step of removing the BLOk film formed between adjacent copper wiring. Further, since the specific dielectric constant of the BLOk film is about 5, an increase in the parasitic capacitance between the adjacent wiring can further be decreased compared with silicon nitride.

Further, another technique as the countermeasure against the increase in the parasitic capacitance between the wiring that is caused when the silicon nitride film is used as the diffusion barrier layer for copper is introduced in Applied Surface Science, Vol. 91 (1995) pp 303–307, and IEEE Electron Device Letters, Vol. 17, No. 12 (1996) pp 549–551. They comprise a method of using an insulative film comprising oxygen, nitrogen and silicon (hereinafter referred to simply as an SiON film) as the diffusion barrier layer for copper. Since the SiON film is also insulative like the silicon nitride layer, it is not necessary for the step of removing the SiON film formed between adjacent copper wiring. Further, since the leak current of the SiON film is relatively approximate to that of the silicon oxide film formed by the usual manufacturing method, there is less worry that the leak current increases between the copper wiring to lower the LSI performance. Further, since the specific dielectric constant of the SiON film is about 5.1 to 5.6, an increase in the parasitic capacitance between the adjacent wiring can further be reduced compared with silicon nitride.

Then, a description is made of another problem that occurs when a silicon nitride film is used as the diffusion barrier layer. In a case where a plurality of layers of copper wiring are integrated on one identical LSI, to establish electrical conduction between different wiring layers, it is necessary to bore a via hole in the insulative film between the wiring layers and bury the hole with a conductor. For this purpose, it is necessary to make an opening in the silicon nitride film as the diffusion barrier layer formed on the upper surface of the copper wiring. However, since the etching rate of the silicon nitride film is lower than that of general insulative films, two major problems arise. A first problem arises in some cases where alignment error is present between the copper wiring and the via hole made thereon. In a case where the via hole has an opening also in a region other than the copper wiring, if the silicon nitride film formed on the copper wiring is etched excessively, since the etching rate of the inter-wire insulative film below the silicon nitride film is high, the interlayer insulative film is engraved. If such phenomenon should occur, burying may sometimes be insufficient upon burying the via hole with the conductor thereby causing conduction failure, or the insulative film of low dielectric constant, when used for the inter-wire insulative film, is denatured to possibly deteriorate the wiring performance. A second problem arises when the thickness of the fabrication mask for the via hole is insufficient upon making the via hole on the copper wiring. When the silicon nitride film on the copper wiring is etched upon making the via hole, the fabrication mask is etched simultaneously. In this case, when the thickness of the fabrication mask is insufficient, the interlayer insulative film below the fabrication mask is etched possibly making the wiring resistance not uniform or the insulative film of low dielectric constant when used below the fabrication mask is denatured to deteriorate the wiring reliability.

DISCLOSURE OF THE INVENTION

In the prior art using the BLOk film described above, no consideration has been taken that the LSI performance is lowered due to long time use since the diffusion preventive performance of the BLOk film against copper is poor compared with the silicon nitride film. Further no consideration has been taken that the current leakage may occur between adjacent copper wiring to deteriorate the LSI performance since the BLOk film results in large leak current.

In the prior art using the SiON film, since the SiON film contains 15 to 33 atm % of nitrogen, the specific dielectric constant is greater than 5. Therefore, this causes a problem that the parasitic capacitance between adjacent copper wiring is increased to increase the wiring delay time, thereby deteriorating the LSI performance.

In the prior art using the BLOk film and the SiON film, while misalignment is caused between the copper wiring and the via hole or the reliability is lowered when the thickness of the fabrication mask is insufficient, no concrete dissolution for the problems have been disclosed.

A first object of this invention is to provide a semiconductor device having copper wiring of high reliability and with less wiring delay time.

A second object of this invention is to provide a method of manufacturing a semiconductor device of high reliability and having copper wiring with less wiring delay time.

The foregoing first object can be attained according to a semiconductor device of this invention comprising a substrate in which semiconductor elements are formed, metal wiring for interconnecting semiconductor elements, and an insulative diffusion barrier layer for covering at least a portion of the metal wiring, in which at least a portion of the surface on the periphery of the metal wiring has a region made of a material comprising copper as a main ingredient, a portion of the region made of the material comprising copper as the main ingredient is in contact with the insulative diffusion barrier layer, and the insulative diffusion barrier layer has characteristics that a specific dielectric constant is 5 or less, a leak current of the insulative diffusion barrier layer at a test temperature of 140° C., under an electric field strength of 2 MV/cm is 10 nA or less per 1 $cm^2$, and the dielectric breakdown lifetime of the insulative diffusion barrier layer when copper is used as an anode at a temperature of 140° C. is at least 100 years.

The foregoing first object can be attained by a semiconductor device according to this invention comprising a substrate in which semiconductor elements are formed, metal wiring for interconnecting the semiconductor elements and an insulative diffusion barrier layer for covering at least a portion of the metal wiring, in which at least a portion of the surface on the periphery of the metal wiring has a region made of a material comprising copper as a main ingredient, a portion of the region made of a material comprising copper as the main ingredient is in contact with the insulative diffusion barrier layer, and the insulative diffusion barrier layer is formed by using a gas mixture containing at least an alkoxy silane represented by the general formula $(RO)_n SiH_{4-n}$ (where n is an integer in a range from 1 to 3 and R represents an alkyl group, aryl group or a derivative thereof) and an oxidative gas, by a plasma CVD method.

Further, the foregoing first object can be attained by a semiconductor device according to this invention comprising a substrate in which semiconductor elements are formed, metal wiring for interconnecting the semiconductor elements and an insulative diffusion barrier layer for covering at least a portion of the metal wiring, in which at least a portion of the surface on the periphery of the metal wiring has a region made of a material comprising copper as a main ingredient, a portion of the region made of the material comprising copper as the main ingredient is in contact with the insulative diffusion barrier layer, and the insulative diffusion barrier layer is formed by using an inorganic silane gas or an organic silane gas and, a nitrogen oxide gas or a gas mixture containing an oxygen atom-containing gas and a nitrogen atom-containing gas by a plasmas CVD method, and comprises oxygen, silicon and nitrogen as the main constituent element, in which a concentration of the nitrogen is from 0.3 to 14 atm %.

Further, the foregoing first object can be attained by a semiconductor device according to this invention comprising a substrate in which semiconductor elements are formed, metal wiring for interconnecting the semiconductor elements, a dry etching stopper layer and an insulative diffusion barrier layer for covering at least a portion of the metal wiring and at least a portion of the dry etching stopper layer, in which the dry etching stopper layer has an opening, the opening is filled with part of the metal wiring, at least a portion of the surface on the periphery of the wiring has a region made of a material comprising copper as the main ingredient, a portion of the region made of the material comprising copper as the main ingredient is in contact with the insulative barrier diffusion layer, and the dry etching rate of the dry etching stopper layer is made one-half or less of that of the dry etching layer of the insulative diffusion barrier layer.

Further, the foregoing first object can be attained by a semiconductor device according to this invention comprising a substrate in which semiconductor elements are formed, first metal wiring for interconnecting the semiconductor elements, an insulative diffusion barrier layer for covering at least the upper surface of the first metal wiring, a first insulative film for covering the insulative diffusion barrier layer, an intermediate stopper film for covering the first insulative film, a second insulative film for covering the intermediate stopper film, a protection insulative film for covering the second insulative film, and second metal wiring filled in openings provided in the insulative diffusion barrier layer, the first insulative film, the intermediate stopper film, the second insulative film and the protection insulative film to ensure electric connection to the first metal wiring, in which at least a portion of the surface on the periphery of the first metal wiring has a region made of a material comprising copper as the main ingredient, a portion of the region made of the material comprising copper as the main ingredient is in contact with the insulative diffusion barrier layer, and the dry etching rate of the intermediate stopper film is one-half or less of that of the insulative diffusion barrier layer.

Further, the foregoing second object is attained by a method of manufacturing a semiconductor device according this invention comprising the steps of: forming, on a substrate in which semiconductor elements are formed, metal wiring having a region at least a portion of the peripheral surface thereof made of a material comprising copper as a main ingredient; and forming, to cover a region of the metal wiring made of the material comprising copper as the main ingredient, an insulative diffusion barrier layer having characteristics that a specific dielectric constant is 5 or less, a leak current of the insulative diffusion barrier layer at a test temperature of 140° C., under an electric field strength of 2 MV/cm is 10 nA or less per 1 $cm^2$, and the dielectric breakdown lifetime of the insulative diffusion barrier layer when copper is used as an anode at a temperature of 140° C. is at least 100 years.

Further, the foregoing second object is attained by a method of manufacturing a semiconductor device according this invention which comprises the steps of: forming, on a substrate in which semiconductor elements are formed, metal wiring having a region at least a portion of the peripheral surface thereof made of a material comprising copper as a main ingredient; and forming, to cover a region of the metal wiring made of the material comprising copper as the main ingredient, an insulative diffusion barrier layer using a gas mixture at least containing an alkoxy silane represented by the general formula $(RO)_n SiH_{4-n}$ (where n is an integer in a range from 1 to 3 and R represents an alkyl group, an aryl group or a derivative thereof) and an oxidative gas by a plasma CVD method.

The specific dielectric constant of the insulative diffusion barrier layer is preferably 1 or more. Since most of insulative materials generally have the specific dielectric constant of 2 or more, it is preferred to use those having 2 to 5 specific dielectric constant. Further, a leak current at the test temperature and under the electric field strength described above is as small as possible. Since most of usual materials have a leak current of 0.01 nA or more per 1 $cm^2$, it is preferred to use those having the leak current from 0.01 to 10 nA.

Further, the foregoing second object can be attained by a method of manufacturing a semiconductor device according this invention which comprises the step of; forming, on a substrate in which semiconductor elements are formed, metal wiring having a region at least a portion of the peripheral surface of which is made of a material comprising copper as a main ingredient; and forming, to cover a region of the metal wiring made of the material comprising copper as the main ingredient, an insulative diffusion barrier layer by using an inorganic silane gas or an organic silane gas and, a nitrogen oxide gas or a gas mixture containing an oxygen atom-containing gas and a nitrogen atom-containing gas by a plasma CVD method, the insulative diffusion barrier layer comprising oxygen, silicon and nitrogen as main constituent elements in which a concentration of the nitrogen is from 0.3 to 14 atm %.

Further, the foregoing second object is attained by the method of manufacturing a semiconductor device according to this invention which comprises the step of: forming, on a substrate in which semiconductor elements formed, an insulative etching stopper layer having an opening; forming, to fill the opening provided in the insulative etching stopper layer, metal wiring having a region at least the upper surface thereof made of a material comprising copper as a main ingredient; and forming an insulative diffusion barrier layer for covering the region of the metal wiring made of the material comprising copper as the main ingredient and the insulative etching stopper layer, in which the dry etching rate of the insulative etching stopper layer is one-half or less of that of the insulative diffusion barrier layer.

Further, the foregoing second object is attained by a method of manufacturing a semiconductor device according to this invention which at least comprises the steps of; forming, on a substrate in which semiconductor elements are formed; first metal wiring having a region at least a portion of the upper surface thereof made of a material comprising copper as the main ingredient; forming an insulative diffusion barrier layer to cover the region of the first metal wiring made of the material comprising copper as the main ingredient; forming a first insulative film, an intermediate stopper film, a second insulative film, a protection insulation film and an etching mask successively to cover the insulative diffusion barrier layer; making a first opening in a portion of the etching mask; making a second opening in a portion of the protection insulative film exposed at the bottom of the first opening; forming a third opening in the second insulative film through the second opening; removing the intermediate stopper layer exposed to the bottom of the third opening to make a fourth opening; and, simultaneously, removing the protection insulative film exposed to the bottom of the first opening; removing the second insulative film below the first opening formed in the etching mask; and, simultaneously, removing the first insulative film below the fourth opening; removing the insulative diffusion barrier layer exposed below the fourth opening to make an opening in the first metal wiring, in which the dry etching rate for the intermediate stopper film is one-half or less of that of the insulative diffusion barrier layer.

BRIEF DESCRIPTION OF THE DRAWINGS

FIG. 4 is a table showing the relation between materials applied to the insulative diffusion barrier layer and characteristics of the semiconductor devices formed.

FIG. 5 is a table showing characteristics for each of P-TMS, P-SiN, BLOk film and P-TEOS.

FIG. 14 is a schematic cross sectional view for a main portion of manufacturing steps for a semiconductor device as Example 4 according to this invention.

FIG. 16 is a schematic cross sectional view illustrating a main portion of steps of manufacturing a semiconductor device according to Example 5 of this invention.

FIG. 17 is a schematic cross sectional view illustrating a main portion of the steps of manufacturing a semiconductor device according to Example 5 of this invention.

BEST MODE FOR CARRYING OUT THE INVENTION

This invention is to be described by way of examples with reference to the drawings. Each of the drawings is depicted schematically with portions unnecessary for explanation being omitted.

EXAMPLE 1

Figure 1:
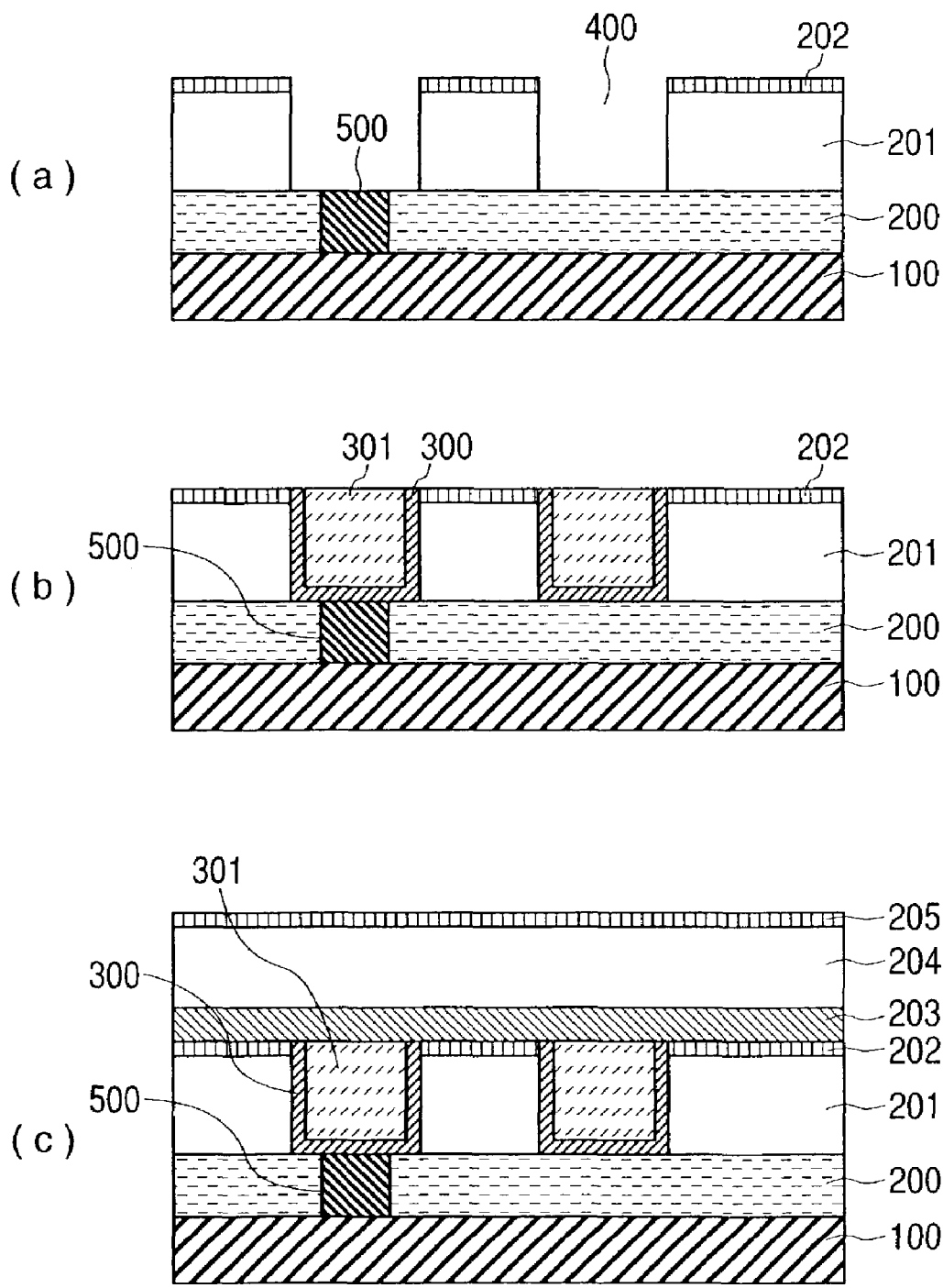
FIG. 1 is a schematic cross sectional view illustrating a main portion of the steps of manufacturing a semiconductor device according to Example 1 of this invention.

FIG. 1 is a cross sectional view showing steps of manufacturing a semiconductor device according to this invention. A description is to be made successively. After forming a first insulative film 200 comprising silicon oxide of 400 nm in thickness on a substrate 100 in which semiconductor elements are formed, an opening was provided at a desired region of the first insulative film 200 in order to establish electrical connection with the substrate 100, and a tungsten plug was filled therein by a CVD method. Then, after coating and baking an SiLK (trade name of products manufactured by The Dow Chemical Company) which is an organic low dielectric constant insulative film to 325 nm in thickness to form a second insulative film 201, a first protection insulative film 202 comprising silicon oxide of 25 nm in thickness was formed by a plasma CVD method. Then, an opening 400 was provided at a desired region of the second insulative film 201 and the first protection insulative film 202 by a combination of a usual photolithographic method and a dry etching method (FIG. 1(*a*)). After successively forming a titanium nitride film of 30 nm in thickness by using a sputtering method and a copper film of 500 nm in thickness by a combination of a sputtering method and an electrolytic plating method so as to fill the opening, the titanium nitride film and the copper film on the first protection insulative film 202 were removed by a CMP (Chemical Mechanical Polishing) method, and copper wiring comprising a first conductive barrier layer 300 made of titanium nitride and a first conductor 301 made of copper were formed so as to fill the opening 400 (FIG. 1(*b*)).

A first insulative diffusion barrier layer 203 of 50 nm in thickness using a gas mixture as the starting material containing trimethoxysilane ($(CH_3O)_3SiH$) as an alkoxy silane and $N_2O$ as an oxidative gas was formed on the copper wiring, by using a parallel plate type plasma CVD method by a double frequency excitation system (13.56 MHz on an electrode side and 380 KHz on a wafer side) disclosed in the catalog for plasma CVD apparatus published from Canon Sales Co., Inc. (Catalog No. 1199SZ1).

Subsequently, the film formed by using trimethoxysilane as the starting material gas is simply referred to as P-TMS. Alkoxy silanes and oxidative gases suitable to be used for the method are described in Japanese Patent Laid-Open No. Hei 7-211712. An example of alkoxy silane is represented by the general formula $(RO)_nSiH_{4-n}$ (n=1 to 3), in which R in the general formula represents an alkyl group, an aryl group or a derivative thereof. Alkyl groups having carbon atoms of 1 to 3 are preferred. Specific example of the alkoxy silane suitably include trimethoxysilane and triethoxysilane ($(C_2H_5)_3SiH$). Further, preferable examples of the oxidative gas include $O_2$, NO, $N_2O$, $NO_2$, CO, $CO_2$ and $H_2O$. Hereinafter, after coating and baking SiLK as an organic dielectric constant insulative film of 325 nm in thickness to form a third insulative film 204 on the first insulative diffusion barrier layer 203 comprising the P-TMS, a second protection insulative film 205 comprising silicon oxide of 25 nm in thickness was formed by a plasma CVD method to constitute a semiconductor device (FIG. 1(*c*)).

In addition to the structure shown in Example 1, a structure of using a silicon nitride film (hereinafter simply referred to as P-SiN) as a first insulative diffusion barrier layer instead of P-TMS, which P-SiN is formed by a plasma CVD method using silane ($SiH_4$) and ammonia ($NH_3$) as the starting material gas, a structure of using a BLOk film, and a structure of using a silicon oxide film (hereinafter simply referred to as P-TEOS) formed by a plasma CVD method using tetraethoxysilane ($(C_2H_5)_4Si$) and $O_2$ as the starting material gas were provided. The thickness of each of the first insulative diffusion barrier layers is 50 nm.

Figure 2:
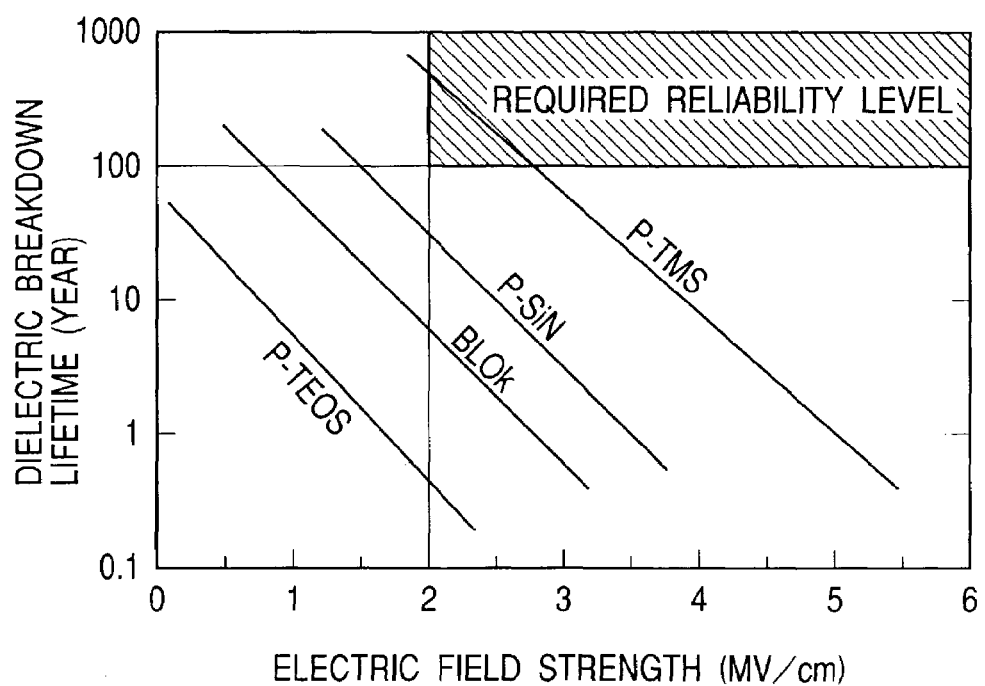
FIG. 2 is a diagram illustrating the electric field strength dependence of dielectric breakdown lifetime at a portion between adjacent copper wiring.

The performance and reliability of the semiconductor devices having copper wiring thus formed were examined. FIG. 2 is a graph showing the relation between the dielectric breakdown lifetime of the insulative films at a portion between adjacent copper wiring in the semiconductor devices thus formed and the electric field strength of the insulative films under extrapolation as far as the dielectric field strength of 2 MV/cm or less. Since the electric field strength applied to the adjacent inter-wiring dielectric film is 2 MV/cm when a voltage of 20 V is applied between adjacent wiring at a distance of adjacent copper wiring of 0.1 μm, it is necessary that the life is 10 years or more under the electric field strength. The power source voltage in the usual LSI is mostly 5 V or less but the LSI is often used while generating higher voltage in the inside depending on the application use, so that the life under 2 MV/cm is desirably 100 years or more in order to improve the durability to accidental failure and improve the reliability and the yield of products (a region shown by hatched line in FIG. 2). As shown in FIG. 2, what can maintain the reliability of 100 years under the electric field strength of 2 MV/cm was a specimen using P-TMS as the insulative diffusion barrier layer.

Figure 3:
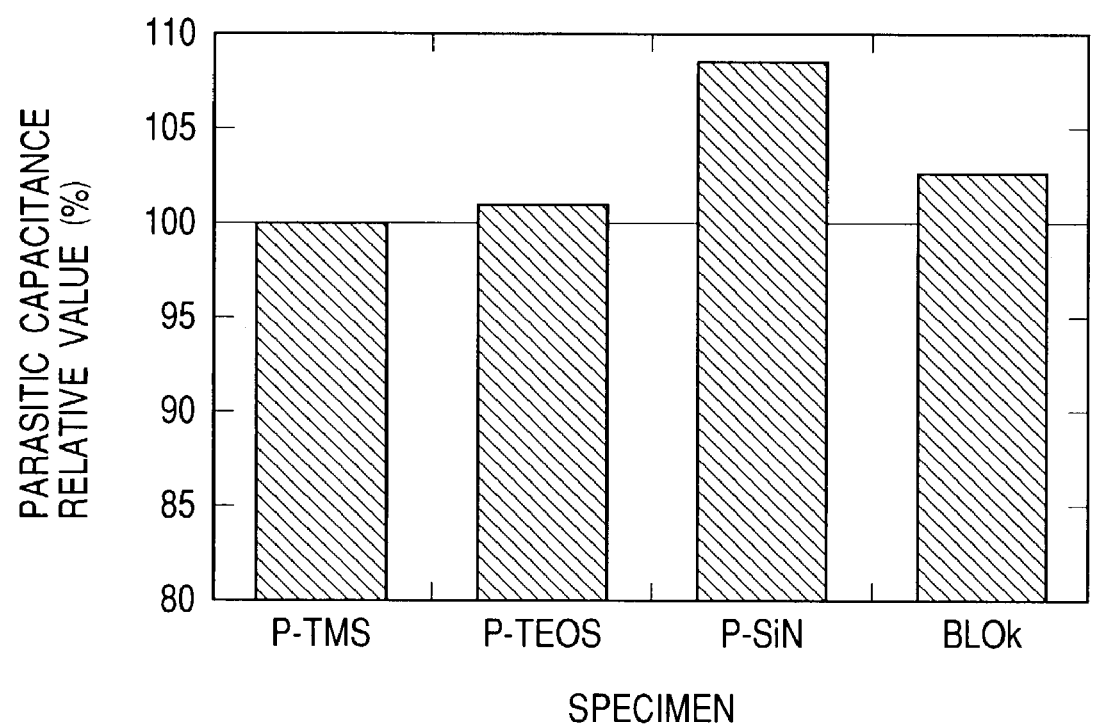
FIG. 3 is a diagram illustrating a relative value of the parasitic capacitance of copper wiring.

Further, using the specimen, when the parasitic capacitance between the adjacent copper wiring was measured by the use of a capacitance-voltage method (CV method), results as shown in FIG. 3 were obtained. The parasitic capacitance value when P-TMS is used as the insulative diffusion barrier layer is expressed as 100%. As can be seen from FIG. 3, the parasitic capacitance is minimized in a case of using P-TMS as the insulative diffusion barrier layer. The parasitic capacitance was largest in a case of using P-SiN as the insulative diffusion barrier layer which was higher by about 10% compared with the case of P-TMS. That is, in a case of using P-SiN as the insulative diffusion barrier layer, it is possible that the speed of signals propagating in the wiring is lowered by about 10%, to deteriorate the LSI performance, compared with a case of using P-TMS, BLOk or P-TEOS. Further, when the leak current between adjacent copper wiring was measured by using the specimen; it was found that the leak current between the adjacent wiring was increased by about 50% in a case of using the BLOk film as the insulative diffusion barrier which may possibly results in erasing of stored information from the capacitance element or an increase in the LSI consumption power compared with a case of using P-TMS, P-SiN or P-TEOS.

FIG. 4 collectively shows the results described above in which the relations among the materials applied to the first insulative diffusion barrier layer 203 shown in FIG. 1 and the characteristics of semiconductor devices formed are compared with one another. As apparent from FIG. 4, a semiconductor device having long time reliability and high performance can be attained only when P-TMS is used as the insulative diffusion barrier layer.

The following evaluation was performed to demonstrate the reason that the semiconductor device of high performance and high reliability was obtained only in the case of using P-TMS as the insulative diffusion barrier layer as described above.

A phosphorus-doped n-silicon substrate (substrate resistivity: 0.02 Ωcm) was provided on which P-TMS of 200 nm in thickness was formed and, a circular copper electrode of 1 mm in diameter and 300 nm in thickness was formed thereon using a vacuum vapor deposition apparatus and a vapor deposition mask to form a specimen. Instead of P-TMS specimen of the structure described above, a specimen formed with P-SiN of 200 nm in thickness, a specimen formed with BLOk of 200 nm in thickness and a specimen formed with P-TEOS of 200 nm in thickness were also provided and four kinds of specimens in total were formed. Specimens in which the insulative film and the circular copper electrode were formed on the n-silicon substrate as described above (hereinafter simply referred to as a planar capacitor specimen) were heated to 140° C., and leak current flowing through four kinds of insulative films was measured while grounding the n-silicon substrate and applying a positive voltage to the copper electrode, and the time till each of the insulation films caused dielectric breakdown was measured. Further, using the specimens, the specific dielectric constant of each of the insulative films was measured by a CV method. FIG. 5 collectively shows the characteristics of each of the insulative films measured as described above. As apparent from FIG. 5, it can be seen that only P-TMS provides an insulative film having characteristics such as, high performance of preventing copper diffusion, a low specific dielectric constant, and a small leak current.

That is, in accordance with the example of this invention, a semiconductor device having copper wiring with high reliability of a insulative film between adjacent copper wiring, low parasitic capacitance between adjacent wiring and with less leak current adjacent wiring can be formed by forming, as the insulative diffusion barrier layer just above the copper wiring, the insulative film having a specific dielectric constant of 5 or less, a leak current at 140° C. and under 2 MV/cm of 10 nA or less per 1 cm$^2$, and a dielectric breakdown life of 100 years or more at 140° C. when using copper as an anode.

In this example, while trimethoxysilane was used as a reaction gas to form the first insulative diffusion barrier layer, there is no particular restriction to the gas and use of other alkoxy silane type gases, for example, triethoxysilane can provide a similar effect. Further, similar effect can also be obtained by using an alkoxy silane in which R is an aryl group in the general formula described above.

Further, while $N_2O$ was used as the oxidative gas to form the first insulative diffusion barrier layer in this example, there is no particular restriction to this gas but a similar effect can be obtained also by the use of a gas containing oxygen atom such as $O_2$, $NO_2$, $NO_2$, $CO$, $CO_2$ and $H_2O$. However, use of a gas with high reactivity to copper such as $O_2$ or $H_2O$ is not preferred since the upper surface of copper wiring is oxidized upon plasma CVD to possibly lower the adhesion or an increase in the wiring resistance.

Further, while the thickness of P-TMS as the first insulative diffusion barrier layer was 50 nm in this example, the thickness of the first insulative diffusion barrier layer may be increased or decreased in accordance with the reliability or parasitic capacitance of the wiring. However, when the thickness of the insulative diffusion barrier layer is reduced, for example, to less than 10 nm, the reliability may possibly be lowered due to the local breakage of a barrier property. On the other hand, in a case where the thickness of the first insulative diffusion barrier layer is increased, for example, in excess of 200 nm, since the specific dielectric constant of the first insulative diffusion barrier layer is generally higher than that of the organic low dielectric constant insulative film used as the second insulative film 201 or the third insulative film 204, it is possible to increase the parasitic capacitance of the wiring. Accordingly, the thickness is preferably in a range from 10 nm to 200 nm and, more preferably, in a range from 30 nm to 100 nm.

Further, in this example, while the second insulative film was formed directly on the first insulative diffusion barrier layer, this invention is not restricted to this example but it is possible to optionally interpose, for example, a dry etching stopper layer between the first insulative diffusion barrier layer and the second insulative film.

Further, in this example, while SiLK which is an organic low dielectric constant insulative film is used as the second insulative film or the third insulative film, the effect of this invention is not provided only by the combination. Similar effects can be expected also by the combination with an organic film containing fluoro resin typically represented by Teflon (trade name of products manufactured by DuPont) or FLARE (trade name of products manufactured by Allied Signal, Inc.), a CVD insulation film using methyltriethoxysilane $((C_2H_5O)_3SiCH_3)$ as the starting gas, an organic containing silicon oxide film containing, for example, Black Diamond (trade name of products manufactured by Applied Materials Co.) or HSG-R7 (trade name of products manufactured by Hitachi Chemical Co., Ltd.), a porous insulation film containing, for example, Nanoglass (trade name of products manufactured by Allied Signal Inc.) or XLK (trade name of products manufactured by Allied Signal Inc.), and an inorganic low dielectric silicon oxide film with addition of fluorine, as the low dielectric constant insulative film. While this invention is also effective on a case of using a usual silicon oxide film of not a low dielectric constant insulative film (specific dielectric constant of about 4) as the second insulative film or the third insulative film, it will be apparent that the combination with the low dielectric constant insulative film is most effective in reducing the parasitic capacitance.

Further, in this example, although the sputtering method and plating method were combined as the copper deposition method, this is not restrictive but the film can be deposited also by a CVD method or the like.

Further, in this example, although the copper wiring layer is formed by only one layer, it is possible to optionally stack the wiring layers successively. This invention is applicable also to a case of filling the via hole with copper in a method of successively forming layers having the via hole for electrically inter-connecting the wiring layers (the so-called single damascene method). Further, this invention is also applicable to a method of collectively forming layers having the via hole for electrically interconnecting wiring layers (the so-called dual damascene method).

EXAMPLE 2

Figure 6:
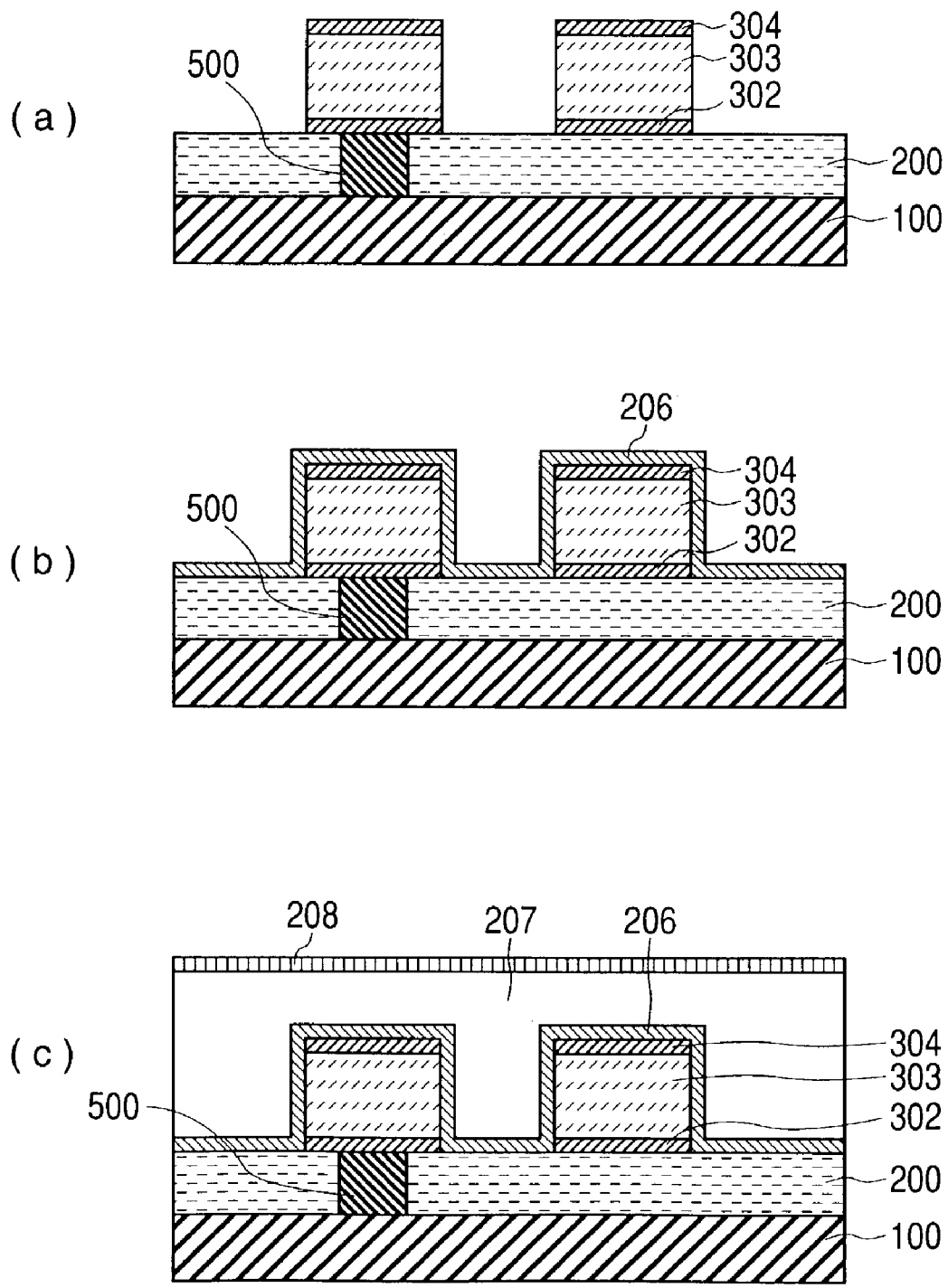
FIG. 6 is a schematic cross sectional view illustrating a main portion of the steps of manufacturing a semiconductor device according to Example 2 of this invention.

FIG. 6 is a cross sectional view showing the steps of manufacturing of a semiconductor device according to this invention. The steps are to be described successively below. After forming a first insulative film 200 comprising silicon oxide of 400 nm in thickness on a substrate 100 in which semiconductor elements are formed, an opening is made at a desired region of the first insulative film 200 to establish electrical connection with the substrate 100, and a tungsten plug 500 is filled by a CVD method. Then, a second conductive barrier layer 302 comprising a titanium nitride film of 25 nm in thickness, a second conductor 303 comprising a copper film of 300 nm in thickness, and a third conductive barrier layer 304 comprising a titanium nitride film of 25 nm in thickness were formed by using a sputtering method. Then, copper wiring comprising a second conductive barrier layer 302, a second conductor 303 and a third conductive barrier layer 304 are formed only at a desired region by using a usual photolithographic method and a dry etching method using a chlorine gas (FIG. 6(a)).

Then, to cover the copper wiring comprising the second conductive barrier layer 302, the second conductor 303 and the third conductive barrier layer 304, P-TMS of 50 nm in thickness was formed as a second insulative diffusion barrier layer 206 using the same method as described in Example 1 and using a gas mixture containing trimethoxysilane and $N_2O$ as the starting gas (FIG. 6(b)). Then, after coating and baking SiLK (trade name) which is an organic low dielectric constant insulative film of 325 nm in thickness to form a fourth insulative film 207, a third protection insulative film 208 comprising silicon oxide of 25 nm in thickness was formed by a plasma CVD method (FIG. 6(c)).

In addition to the structure shown in Example 2, structures using P-SiN, BLOk and P-TEOS instead of P-TMS as the second insulative diffusion barrier layer 206 were provided. The thickness of each of the second insulative diffusion barrier layers is 50 nm.

When the performance and the reliability of semiconductor devices having the copper wiring formed as described above were examined, semiconductor devices having long time reliability and high performance could be attained only in the case of using P-TMS as the second insulative diffusion barrier layer like that shown in Example 1.

That is, in accordance with the example of this invention, a semiconductor device having copper wiring with high reliability of the insulative film between adjacent copper wiring, low parasitic capacitance between adjacent wiring and with less leak current in adjacent wiring can be formed by forming, as the insulative diffusion barrier layer just above the copper wiring, an insulative film having a specific dielectric constant of 5 or less, a leak current at 140° C. and under 2 MV/cm of 10 nA or less per 1 $cm^2$, and a dielectric breakdown lifetime of 100 years or more at 140° C. when using copper as an anode.

In this example, while trimethoxysilane was used as a reaction gas when the second insulative diffusion barrier layer was formed, there is no particular restriction to the gas and use of other alkoxy silane type gases can provide a similar effect.

Further, while $N_2O$ was used as the oxidative gas when the second insulative diffusion barrier layer was formed in this example, there is no particular restriction to the gas but a similar effect can be obtained also with a gas containing oxygen atom such as $O_2$, NO, $NO_2$, CO, $CO_2$ and $H_2O$. However, use of a gas with high reactivity to copper such as $O_2$ or $H_2O$ is not preferred since the upper surface of copper wiring is oxidized upon plasma CVD to possibly lower the adhesion or increase the wiring resistance.

Further, while the thickness of P-TMS as the second insulative diffusion barrier layer was 50 nm in this example, the thickness of the first insulative diffusion barrier layer may be increased or decreased in accordance with the reliability or the parasitic capacitance of the wiring. However, when the thickness of the insulative diffusion barrier layer is reduced, for example, to less than 10 nm, the reliability may possibly be lowered due to the local breakage of the barrier property. On the other hand, in a case where the thickness of the second insulative diffusion barrier layer is increased, for example, in excess of 200 nm, since the specific dielectric constant of the second insulative diffusion barrier layer is generally higher than that of the organic low dielectric constant insulative film used as the fourth insulative film 207, it may possibly increase the parasitic capacitance of the wiring. Accordingly, the thickness is preferably in the range described in Example 1.

Further, in this example, while SiLK which is the organic low dielectric constant insulative film is used as the fourth insulative film or the third insulative film, the effect of this invention is not provided only by the combination. Similar effects can be expected also by the combination with an organic film containing fluoro resin typically represented by Teflon (trade name of products manufactured by DuPont) or FLARE (trade name of products manufactured by Allied Signal, Inc.), a CVD insulation film using methyltriethoxysilane as the starting gas, an organic containing silicon oxide film containing, for example, Black diamond (trade name of products manufactured by Applied Materials Co.) or HSG-R7 (trade name of products manufactured by Hitachi Chemical Co., Ltd.), a porous insulation film containing, for example, Nanoglass (trade name of products manufactured by Allied Signal Inc.) or XLK (trade name of products manufactured by Allied Signal Inc.), and an inorganic low dielectric silicon oxide film with addition of fluorine, as the low dielectric constant insulative film. While this invention is also effective on a case of using a usual silicon oxide film of not a low dielectric constant insulative film (specific dielectric constant of about 4) as the second insulative film or the third insulative film, it will be apparent that the combination with the low dielectric constant insulative film is most effective in reducing the parasitic capacitance.

Further, in this example, the sputtering method was combined as the copper deposition method, this is not restrictive but film can be deposited also by a CVD method or the like.

Further, in this example, although the copper wiring layer is formed by only one layer, it is possible to optionally stack the wiring layers successively.

EXAMPLE 3

Figure 7:
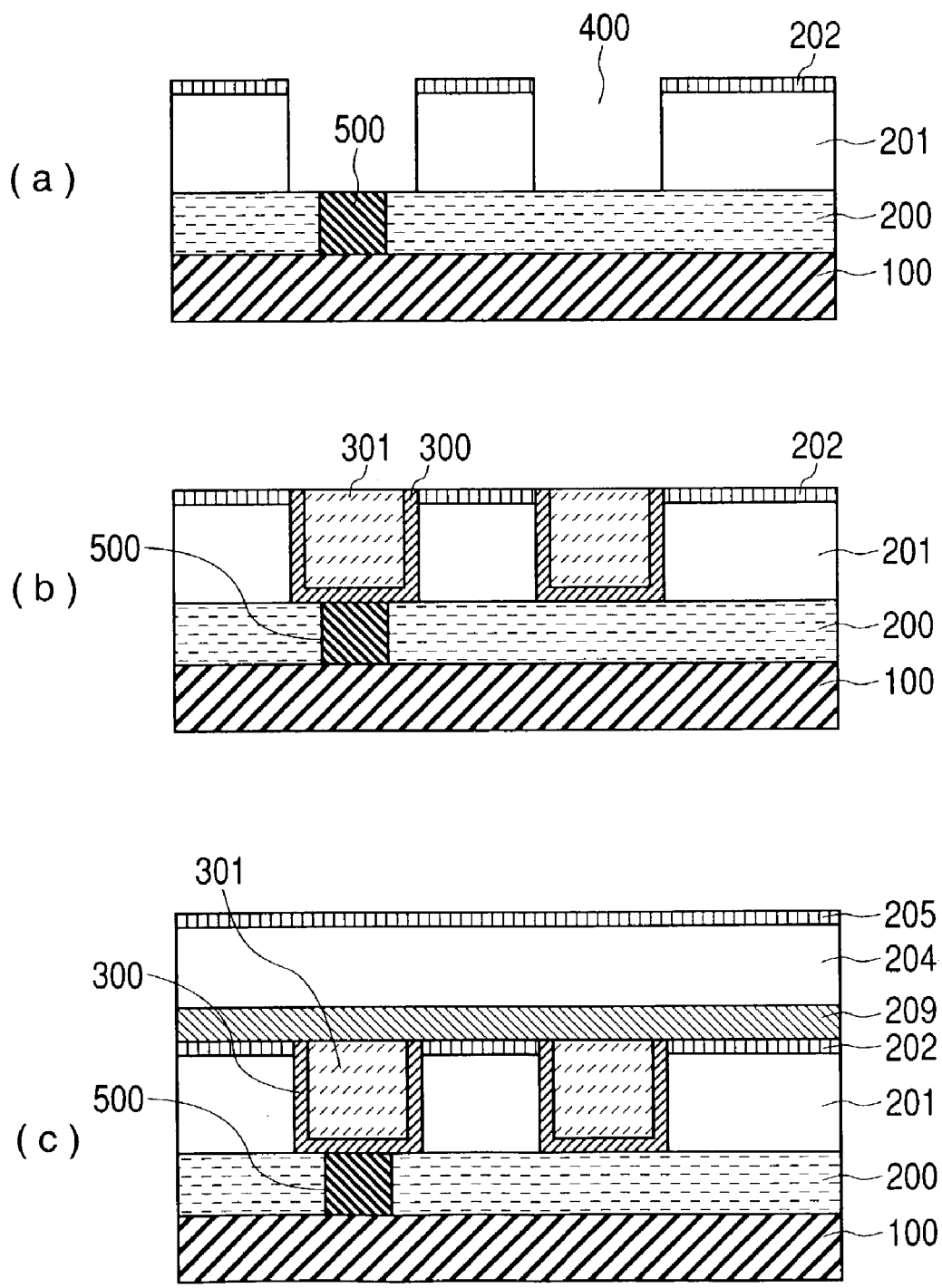
FIG. 7 is a schematic cross sectional view illustrating a main portion of the steps of manufacturing a semiconductor device according to Example 3 of this invention.

FIG. 7 is a cross sectional view showing the steps of manufacturing a semiconductor device according to this invention. The steps are to be described successively below. After forming a first insulative film 200 comprising silicon oxide of 400 nm in thickness on a substrate 100 in which semiconductor elements are formed, an opening is provide at a desired region of the first insulative film 200 to establish electrical connection with the substrate 100, and a tungsten plug 500 is filled by a CVD method. Then, after coating and baking an SiLK (trade name of products manufactured by Dow Chemical Company) which is the organic low dielectric constant insulative film to 325 nm in thickness to form a second insulative film 201, a first protection insulative film 202 comprising silicon oxide of 25 nm in thickness was formed by a plasma CVD method. Then, an opening 400 is provided at a desired region of the second insulative film 201 and the first protection insulative film 202 by combination of usual photolithographic method and dry etching method (FIG. 7(a)).

After forming a titanium nitride film of 30 nm in thickness by using a sputtering method and a copper film of 500 nm in thickness by combination of a sputtering method and an electrolytic plating method so as to fill the opening, the titanium nitride film and the copper film on the first protection insulative film 202 were removed by a CMP (Chemical Mechanical Polishing) method, and copper wiring comprising a first conductive barrier layer 300 made of titanium nitride and a first conductor 301 made of copper were formed so as to fill the opening 400 (FIG. 7(b)).

On the copper wire, a third insulative diffusion barrier layer 209 of 50 nm in thickness was formed from a gas mixture comprising silane ($SiH_4$) and $N_2O$ as an oxidative gas as the starting material gas by using a parallel plate type plasma CVD method. The plasma power was 40 W, the silane flow rate was 50 cc/min, the $N_2O$ flow rate was 2000 cc/min and substrate temperature was 350° C. Hereinafter, the film formed by using silane and $N_2O$ as the starting gas is simply referred to as P-MSO.

Then, after coating and baking SiLK which is the organic low dielectric constant insulative film of 325 thickness to form a third insulative film 204 on the third insulative diffusion barrier layer 209 comprising P-MSO, a second protection insulative film 205 comprising silicon oxide of 25 nm in thickness was formed by a plasma CVD method to constitute a semiconductor device (FIG. 7(c)).

In the structure shown in Example 3, several kinds of specimens were prepared while varying the plasma power, silane flow rate and $N_2O$ flow rate. Further, a specimen using P-TMS instead of P-MSO as the third insulative diffusion barrier layer was also provided. In this case, several kinds of specimens were provided varying the plasma power, trimethoxysilane flow rate and $N_2O$ flow rate when forming P-TMS as the third insulative diffusion barrier layer. Further, a structure of using P-SiN and a structure of using a BLOk film instead of P-MSO and P-TMS as the third insulative diffusion barrier layer were provided. The thickness of each of the third insulative diffusion barrier layers is 50 nm.

The performance of the semiconductor devices having copper wiring thus formed were examined. When parasitic capacitance between adjacent copper wiring formed in each of the semiconductor devices was measured by a capacitance-voltage method (CV method) by using the same method as shown in Example 1, the parasitic capacitance in a case of using P-MSO as the insulative diffusion barrier layer was substantially equal with the parasitic capacitance in the case of using P-TMS in Example 1 (FIG. 3). That is, since the parasitic capacitance can be decreased by about 10% compared with the case of using P-SiN as the insulative diffusion barrier layer, the speed of signals propagating in the wiring can be improved by about 10%. Further, when leak current between adjacent copper wiring was measured by using the specimen, it was found that the leak current between the adjacent wiring was increased by about 50% in a case of using the BLOk film as the insulative diffusion barrier layer compared with a case of using P-MSO, P-TMS or P-SiN, and it may possibly result in erasing of stored information from the capacitance element and an increase in the LSI consumption power.

Figure 8:
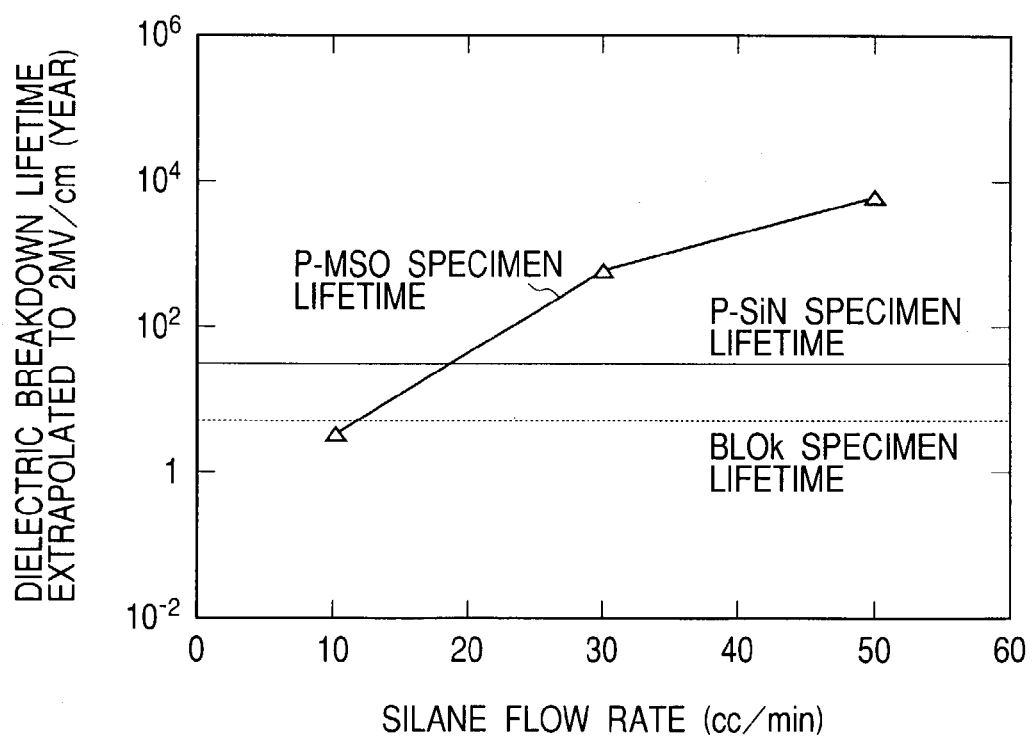
FIG. 8 is a diagram showing the relation between the dielectric breakdown life under the electric fields intensity of 2 MV/cm determined from the electric field dependence of dielectric breakdown life at a portion between adjacent copper wiring, and the silane flow rate upon P-MSO deposition.

Then, the reliability of semiconductor devices having copper wiring described above was examined and the result is to be explained mainly in the case of using P-MSO. FIG. 8 is an example thereof. In FIG. 8, the abscissa represents a silane flow rate when P-MSO is deposited as the third insulative diffusion barrier layer, while the ordinate represents the dielectric breakdown lifetime under the electric field strength of 2 MV/cm calculated from the electric field dependence of the dielectric breakdown life between adjacent copper wiring. A $N_2O$ flow rate is 1000 cc/min and plasma power is 30 W upon P-MSO deposition. As apparent from FIG. 8, by setting the silane flow rate as 30 cc/min and 50 cc/min upon deposition of P-MSO, it has been found that necessary and sufficient reliability can be obtained which are superior to the case of using BLOk or P-SiN. The same trend, that is, the trend capable of obtaining necessary reliability when the trimethoxysilane flow rate exceeds a predetermined value was found also in the P-TMS structure.

Figure 9:
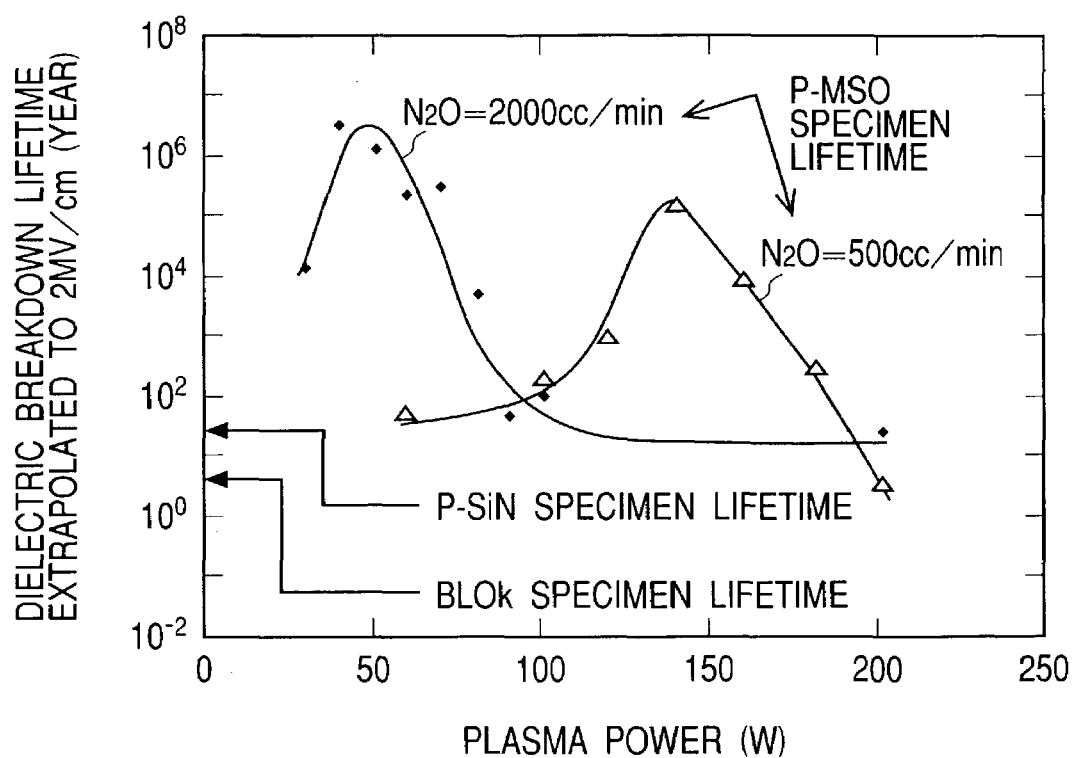
FIG. 9 is a diagram illustrating the relation between the dielectric breakdown life under the electric fields intensity of 2 MV/cm determined from the electric field dependence of the dielectric breakdown life between adjacent copper wiring, and plasma power upon P-MSO deposition.

Then, FIG. 9 shows a second example illustrating a relation between film deposition conditions upon P-MSO deposition and dielectric breakdown life between adjacent copper wiring. A relation between the dielectric breakdown life between adjacent copper wiring under the electric field strength of 2 MV/cm and the plasma power was examined by the same method as illustrated in FIG. 8, while setting the silane flow rate for 50 cc/min in two cases of the $N_2O$ flow rate of 500 cc/min and 2000 cc/min. As apparent from FIG. 9, it was found that necessary and sufficient reliability superior to the case of using BLOk or P-SiN could be obtained by setting the plasma power from 100 W to 180 W for the silane flow rate of 50 cc/min and $N_2O$ flow rate of 500 cc/min upon P-MSO deposition and by setting the plasma power to 30 W to 80 W for the silane flow rate of 50 cc/min and $N_2O$ flow rate of 2000 cc/min. In the same manner, similar plasma power dependence was also observed in P-TMS specimen.

Figure 10:
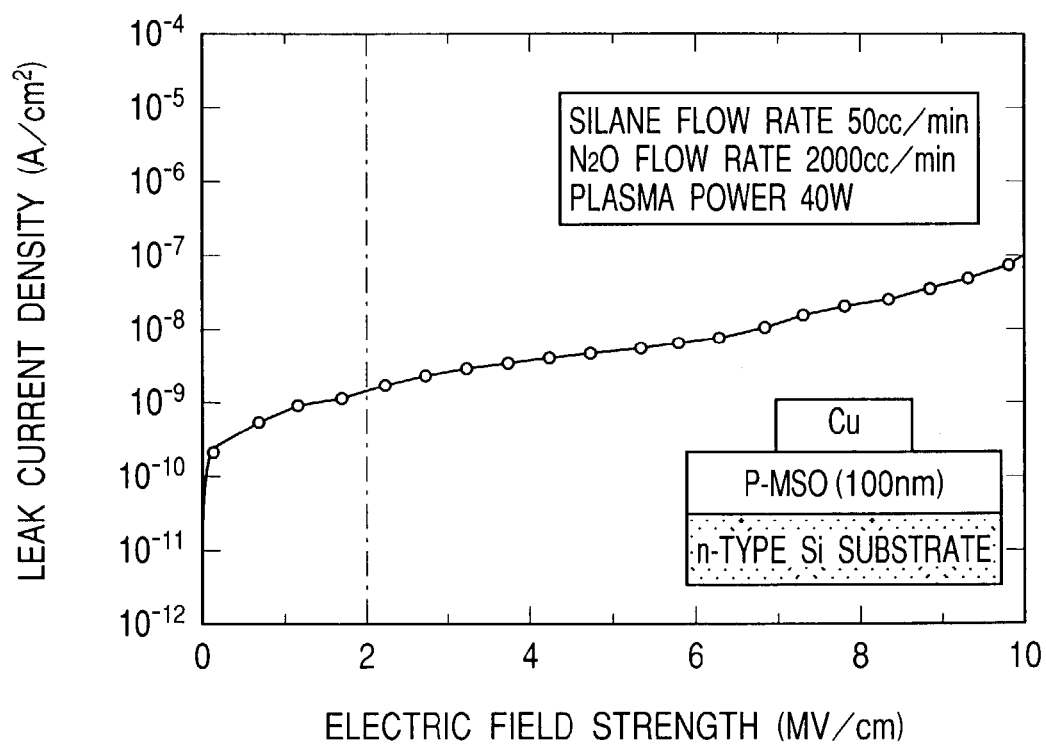
FIG. 10 is a diagram showing the electric field intensity dependence of the leak current density in a P-MSO film formed on an n-type silicon substrate.

Then, the leak current and the specific dielectric constant of the P-MSO film formed by using film deposition conditions by which the necessary and sufficient reliability of copper wiring superior to that using the BLOk or P-SiN as shown in FIGS. 8 and 9 was obtained were measured. FIG. 10 shows an example. After forming P-MSO of 100 nm in thickness on an n-silicon substrate at a silane flow rate of 50 cc/min, a $N_2O$ flow rate of 2000 cc/min and at a plasma power of 40 W, a circular copper electrode was vapor deposited. Then, FIG. 10 shows a result of applying an electric field to P-MSO using the copper electrode as the positive electrode and measuring the leak current in the P-MSO film with a pico-ampere meter. The leak current under the electric field strength of 2 MV/cm was about 2 nA ($=2 \times 10^{-9}$ A) per 1 $cm^2$. Further, the specific dielectric constant of the specimen measured by using the CV method was 4.1. Further, when a time leading to dielectric breakdown at 140° C. by applying an electric field to P-MSO using copper as the positive electrode by using the specimen, a result of about 3000 years was obtained. Only one example is described here for each of the leak current, specific dielectric constant and life to dielectric breakdown, in P-MSO formed by using film deposition conditions capable of obtaining necessary and sufficient reliability for copper wiring superior to that using the BLOk or P-SiN as shown in FIGS. 8 and 9, the leak current under 2 MV/cm was in a range from 1 nA to 10 nA per 1 $cm^2$, the specific dielectric constant was in a rage from 3.9 to 4.7 and the dielectric breakdown lifetime was 100 years or more. Similar trends were also observed in a case of using P-TMS although the details thereof were omitted.

Figure 11:
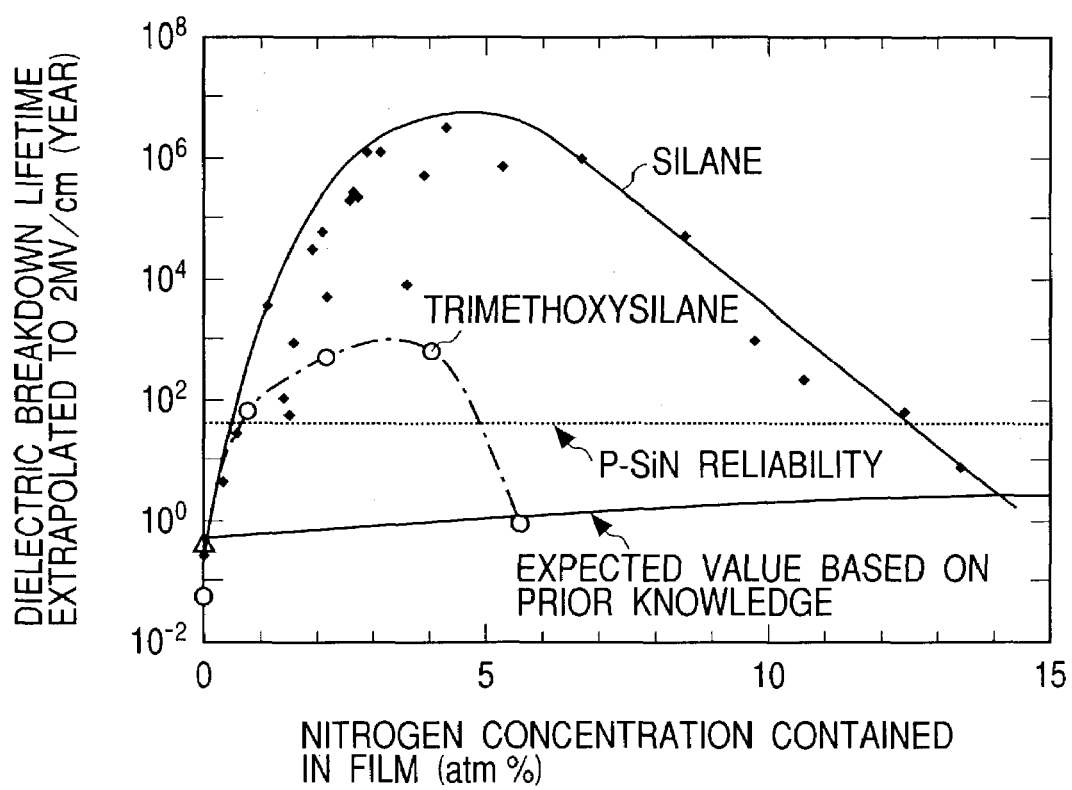
FIG. 11 is a diagram illustrating a relation between the dielectric breakdown life under the electric field intensity of 2 MV/cm determined from the electric field dependence of the dielectric breakdown life between adjacent copper wiring and the nitrogen concentration contained in P-MSO and P-TMS.

Then, as a result of a further detailed study on the characteristics of P-MSO and P-TMS, it was found that P-MSO and P-TMS formed by using film deposition conditions capable of obtaining necessary and sufficient reliability of copper wiring superior to that using the BLOk or P-SiN have common features. As a result of analysis on the composition of P-MSO and P-TMS by an XPS (X-ray Photoelectron Spectroscopy) method and an SIMS (Secondary Ion Mass Spectroscopy) method, it was found that P-MSO and P-TMS contained mainly silicon and oxygen and a minute amount of nitrogen, and a relation exists between the nitrogen concentration contained in the film and the dielectric breakdown lifetime between adjacent copper wiring extrapolated to 2 MV/cm. FIG. 11 is a graph showing an example.

As apparent from FIG. 11, it can be seen that a semiconductor device having a dielectric breakdown lifetime of 100 years or more can be formed in a region of the nitrogen concentration from 0.5 atm % to 12 atm % contained in P-MSO and P-TMS.

Further, as apparent from FIG. 11, it was found that the semiconductor device having higher reliability than in the case of using P-SiN film and a block film as the existent material can be formed in a region of the nitrogen concentration from 0.5 to 12.5 atm % contained in P-MSO and P-TMS.

Figure 12:
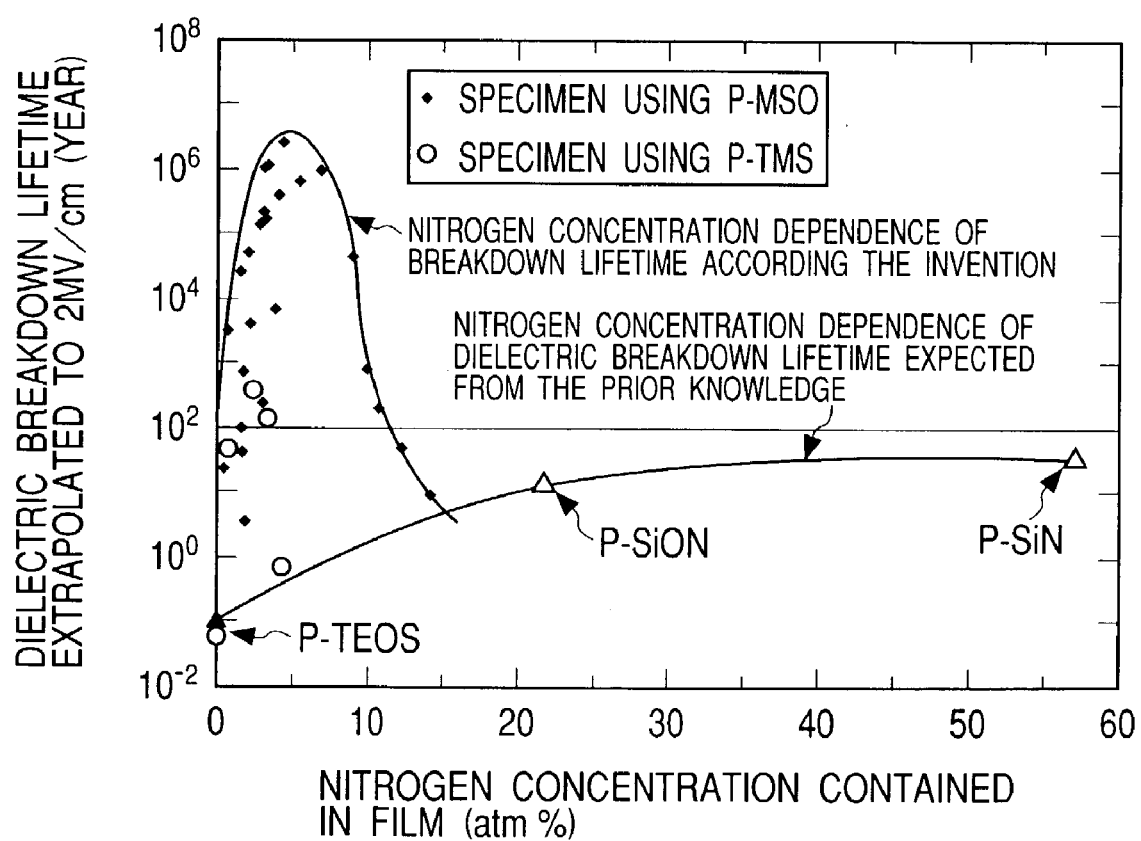
FIG. 12 is a diagram showing the relation between the dielectric breakdown lifetime under the electric field strength of 2 MV/cm determined from the electric field dependence of the dielectric breakdown lifetime at a portion between adjacent copper wiring and the nitrogen concentration contained in P-MSO and P-TMS.

Further, for the compound comprising nitrogen, oxygen and silicon on which a Cu barrier property has been studied, the Cu barrier property was studied for silicon oxide typically represented, for example, by P-TEOS with the nitrogen concentration of 0%, P-SiN with the nitrogen concentration of about 57% and SiON with the nitrogen concentration at an intermediate value between them (about 20%). The relation between the dielectric breakdown lifetime and the nitrogen concentration using the materials described above is as shown in FIG. 12. Since the dielectric breakdown lifetime tends to be increased as the nitrogen concentration increases, it was considered that the Cu barrier property was improved as the nitrogen concentration in the film was higher in such compound comprising nitrogen, oxygen and silicon. However, as shown in FIGS. 11 and 12, in the P-MSO and P-TMS comprising silicon, oxygen and nitrogen as the main constituent elements obtained in this invention, it can be seen that there is a range in which a semiconductor device can be formed which has a high reliability superior to the expected value in the existent relation between the dielectric breakdown lifetime and the nitrogen concentration, within a range of the nitrogen concentration contained in the film from 0.3 to 14 atm %.

Further, as shown in FIG. 11, in the use of P-TMS, it included those of short dielectric breakdown lifetime while the nitrogen concentration contained in the film was about 5 atm %. When the characteristics of the P-TMS films formed under such conditions were examined, the characteristics were deteriorated such that the leak current in the film was about 2 µA (=2×10$^{-6}$ A) per 1 cm$^2$ and the specific dielectric constant was about 6. To examine the reason, when the P-TMS films deposited under such conditions were subjected to FT-IR analysis (Fourier Transformation Infrared Spectroscopy), it was found that a great amount of carbon was contained in the films. As described above, even when the nitrogen concentration contained in the film was within an appropriate range as described above, if the film deposition condition was not appropriate, no desired reliability could sometimes be obtained, for example, because of the increased amount of carbon in the films.

That is, in accordance with the example of this invention, it is possible to form a semiconductor device having copper wiring with high reliability for the insulative film between adjacent copper wiring, low parasitic capacitance between adjacent wiring and less leak current between adjacent wiring by forming, as an insulative diffusion barrier layer just above the copper wiring, an insulative film having a dielectric specific constant of 5 or less and a leak current at 140° C. under 2 MV/cm of 10 nA or less per 1 cm$^2$ and a dielectric breakdown lifetime of 100 years or more at 140° C. when using copper as an anode, by using silane or trimethoxysilane and N$_2$O as a starting material gas by using a plasma CVD method.

Further, in accordance with the example of this invention, it is possible to form a semiconductor device having copper wiring having a dielectric breakdown lifetime under the electric field intensity of 2 MV/cm of 100 years or more, low parasitic capacitance between adjacent wiring and less leak current between adjacent currents by forming, as an insulative diffusion barrier layer just above the copper wiring, a silicon oxide film containing nitrogen from silane or trimethoxysilane and N$_2$O as a starting material gas and using plasma CVD method and controlling the nitrogen concentration in a range from 0.5 to 12 atm %.

Further, in accordance with the example of this invention, it is possible to form a semiconductor device having copper wiring having reliability superior to a case of using the silicon nitride film and the BLOk film as the existent material, low parasitic capacitance between adjacent wiring and less leak current between adjacent wiring by forming, as an insulative diffusion barrier layer just above copper wiring, a silicon oxide film containing nitrogen in which the nitrogen concentration controlled in a range from 0.5 to 12.5 atm %, by using silane or trimethoxysilane and N$_2$O as a starting material gas by a plasma CVD method.

Further, in accordance with the example of this invention, it is possible to form a semiconductor device having copper wiring having an insulation reliability superior to the prior knowledge, low parasitic capacitance between adjacent wiring and less leak current between adjacent wiring by forming, as an insulative diffusion barrier layer just above the copper wiring, a silicon oxide film containing nitrogen in which the nitrogen concentration is controlled in a range from 0.3 to 14 atm % by using silane or trimethoxysilane and N$_2$O as a starting material gas and using a plasma CVD method.

In this example, while silane (SiH$_4$) was used as the reaction gas upon formation of the third insulative diffusion barrier layer, there is no particular restriction to such gas but similar effects can be obtained also by using other higher silanes represented by the general formula Si$_n$H$_{(2n+2)}$ (n is an integer of 1 or more), for example, disilane (Si$_2$H$_6$). Since molecules constituting the gas of higher silanes have no organic groups, they have a merit of a less possibility of deterioration in the reliability such as an increase in leak current because of incorporation of current into the film.

Further, in this example, trimethoxysilane ((OCH$_3$)$_3$SiH) as an organic silane gas was also used as the reaction gas upon formation of the third insulative diffusion barrier layer, there is no particular restriction on such gas but similar effects can also be obtained by using other organic silane type gases represented, for example, by the general formulae R$_n$SiH$_{4-n}$, (RO)$_n$SiH$_{4-n}$, R$_m$Si$_2$H$_{6-m}$, (RO)$_m$Si$_2$H$_{6-m}$, (RO)$_n$SiR'$_{4-n}$ (where n is an integer of 1 to 4, m is an integer of 1 to 6, R and R' each represent an alkyl group, aryl group or derivative thereof). The organic silane type gases are likely to pose problems that carbon is incorporated into the insulative diffusion barrier layer to deteriorate the insulation characteristics or increase a specific dielectric constant but they have a merit that the handleability of the starting gas is easier since the ignition point is low unlike inorganic silane.

Further, while N$_2$O was used in this example as the oxidative gas upon formation of the third insulative diffusion barrier layer, there is no particular restriction on such gas but similar effects can be obtained also by other oxide type gases, for example, NO and NO$_2$. Further, similar effects can be obtained also with a gas mixture containing an oxygen atom-containing gas such as $O_2$, CO, $CO_2$ and $H_2O$ and a nitrogen atom-containing gas such as $N_2$ and $NH_3$, in addition to the silicon oxide gas described above. Further, it is also possible to deposit films while mixing the noted nitrogen oxide type gas in the gas mixture. However, use of a gas having high reactivity with copper such as $O_2$ or $H_2O$ is not preferred since the upper surface of the copper wiring is oxidized upon plasma CVD, to possibly lower the adhesion or increase the wiring resistance.

Further, while the parallel plate type plasma excitation system was used as the plasma excitation system in this example, the invention is not restricted only to this system and plasma excitation system typically represented by induction coupled plasma excitation system, electron cyclotron resonance plasma excitation system or the like can also be used in addition to the system described above.

Further, in this example, while the thickness of P-MSO and P-TMS as the third insulative diffusion barrier layer was 50 nm, the thickness of the third insulative diffusion barrier layer may be increased or decreased in accordance with the reliability or parasitic capacitance of the wiring. However, when the thickness of the third insulative diffusion barrier layer is reduced, for example, to less than 10 nm, the reliability may possibly be lowered due to the local breakage of a barrier property. On the other hand, in a case where the thickness of the first insulative diffusion barrier layer is increased, for example, in excess of 200 nm, since the specific dielectric constant of the third insulative diffusion barrier layer is generally higher than that of the organic low dielectric constant insulative film used as the second insulative film 201 or the third insulative film 204, it is possible to increase the parasitic capacitance of the wiring. Accordingly, the thickness is preferably in a range from 10 nm to 200 nm and, more preferably, in a range from 30 nm to 100 nm.

Further, in this example, while the third insulative film was formed directly on the second insulative diffusion barrier layer, this invention is not restricted to this example but it is possible to optionally interpose, for example, a dry etching stopper layer between the third insulative diffusion barrier layer and the second insulative film.

Further, in this example, while SiLK which is the organic low dielectric constant insulative film is used as the second insulative film or the third insulative film, the effect of this invention is not provided only by the combination. Similar effects can be expected also by the combination with an organic film containing fluoro resin typically represented by Teflon (trade name of products manufactured by DuPont) or FLARE (trade name of products manufactured by Allied Signal, Inc.), a CVD insulation film using methyltriethoxysilane (($C_2H_5O)_3SiCH_3$) as the starting material gas, an organic containing silicon oxide film containing, for example, Black Diamond (trade name of products manufactured by Applied Materials Co.) or HSG-R7 (trade name of products manufactured by Hitachi Chemical Co., Ltd.), a porous insulation film containing, for example, Nanoglass (trade name of products manufactured by Allied Signal Co.) or XLK (trade name of products manufactured by Allied Signal Co.), and an inorganic low dielectric silicon oxide film with addition of fluorine, as the low dielectric constant insulative film. While this invention is effective also to a case of using a usual silicon oxide film of not a low dielectric constant insulative film (specific dielectric constant of about 4) as the second insulative film or the third insulative film, it will be apparent that the combination with the low dielectric constant insulative film is most effective in reducing the parasitic capacitance.

Further, in this example, while the sputtering method and the plating method were combined with each other as the copper deposition method, this is not restrictive but the film can be deposited also by a CVD method or the like.

Further, in this example, while the copper wiring layer is formed only by one layer, it is possible to optionally stack the wiring layers successively. This invention is applicable also to a case of filling a via hole with copper in a method of successively forming layers having via holes for electrically inter-connecting the wiring layers (the so-called single damascene method). Further, this invention is also applicable to a method of collectively forming layers having via holes for electrically inter-connecting wiring layers (so-called dual damascene method).

EXAMPLE 4

Figure 13:
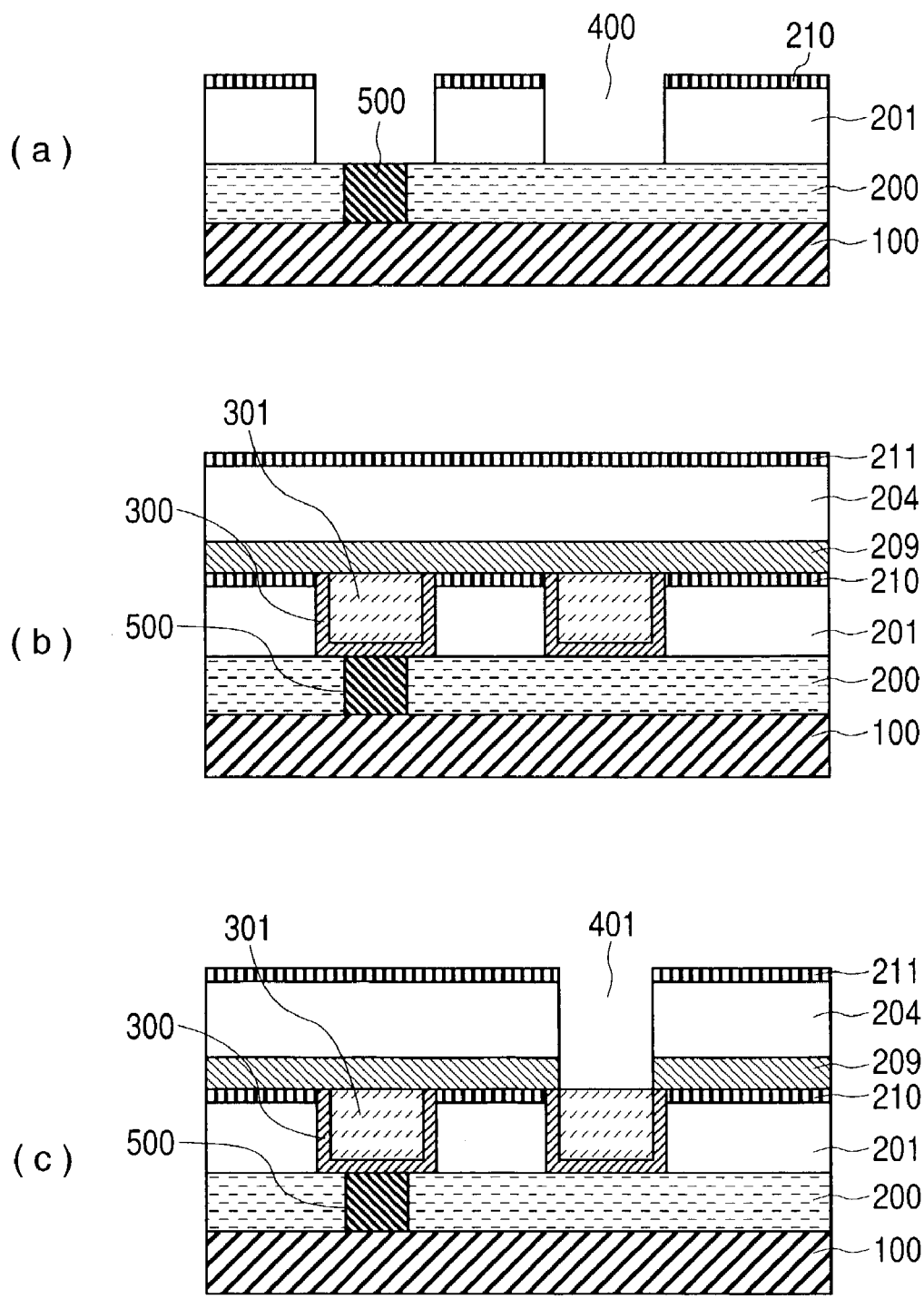
FIG. 13 is a schematic cross sectional view illustrating a main portion of the steps of manufacturing a semiconductor device according to Example 4 of this invention.

FIGS. 13 and 14 are cross sectional views showing the steps of manufacturing a semiconductor device according to this invention. The steps are to be described successively below. After forming a first insulative film 200 comprising a silicon oxide of 400 nm in thickness on a substrate 100 in which semiconductor elements were formed, an opening was provided at a desired region of the first insulative film 200 to establish electrical connection with the substrate 100, and a tungsten plug 500 was filled by a CVD method. Then, after coating and baking SiLK which is an organic low dielectric constant insulative film (trade name of products manufactured by Dow Chemical Company) of 325 nm in thickness to form a second insulative film 201, a first etching stopper layer and protection insulative film 210 comprising silicon carbide as a main ingredient of 25 nm in thickness was formed by a plasma CVD method. Then, an opening 400 was provided at a desired region of the second insulative film 201 and the first etching stopper layer and protection insulative film 210 by the combination of a usual photolithographic method and a dry etching method (FIG. 13(a)).

After forming a titanium nitride film of 40 nm in thickness by using a sputtering method and a copper film of 500 nm in thickness by the combination of a sputtering method and an electrolytic plating method successively so as to fill the opening, the titanium nitride film and the copper film on the first etching stopper layer and protection insulative film 210 were removed by a CMP method, and a first copper wiring layer comprising a first conductive barrier layer 300 of titanium nitride and a first conductor 301 of copper were formed so as to fill the opening 400. Then, as described in Example 3, a third insulative diffusion barrier layer 209 comprising P-MSO (nitrogen concentration: 3 atm %) of 50 nm in thickness was formed using a gas mixture containing silane and $N_2O$ as the starting material gas by a parallel plate type plasma CVD system and, after coating and baking SiLK as the organic low dielectric constant insulative film of 335 nm in thickness on the third insulative diffusion barrier layer 209 comprising P-MSO to form a third insulative film 204, a second etching stopper layer and protection insulative film 211 comprising silicon carbide as a main ingredient of 25 nm in thickness was formed (FIG. 13(b)).

Then, a second opening 401 was provided at a desired region of the third insulative diffusion barrier layer 209, the third insulative film 204 and the second etching stopper layer and protection insulative film 211 by the combination of a usual photolithographic method and a dry etching method (FIG. 15(c)). A copper wiring interlayer via hole comprising a fourth conductive barrier layer 305 of titanium nitride and a third conductor 306 of copper was formed so as to fill the second opening 401 by the combination of a sputtering method, an electrolytic method and an CMP method to fill the opening (FIG. 14(a)).

Then, a fourth insulative diffusion barrier layer 212 and a fifth insulative film 213 and a third etching stopper layer and protection insulative film 214, as well as a second copper wiring layer having an opening at a desired region thereof and comprising a fifth conductive barrier layer 307 of titanium nitride and a fourth conductor 308 of copper so as to fill the opening were formed on the via holes by repeating the steps described above, to constitute a semiconductor device (FIG. 14(b)).

In the structure shown in Example 4, while the plasma CVD film comprising silicon carbide as the main ingredient of 20 nm in thickness was used for the first etching stopper layer and protection insulative film 210, the second etching stopper layer and protection insulative layer 211, several kinds of specimens formed by using each of silicon oxide, silicon nitride, organic group-containing silicon oxide and aluminum oxide were additionally prepared.

When the performance and the reliability of the thus formed semiconductor devices were examined, a result was obtained that variations in the electric resistance of the second copper wiring layer was large to lower the conduction yield of the copper wiring interlayer via hole in a case of the specimens using silicon oxide as the first and second etching stopper layers and protection insulations, compared with a case of using other materials. To examine the reason, when the cross section of the second wiring layer and the interlayer via hole was observed under an SEM (Secondary Electron Scanning type Electron Microscope), it was observed in the specimen using silicon oxide that when the second opening 401 has an opening in a region other than the first copper wiring layer, the first etching stopper layer and protection insulative film 210 just below the opening is dissipated to expose the second insulative film 201 or engrave the second insulative film 201 failing to conduct normal burying of the copper wiring interlayer via hole. Further, in the region where the second copper wiring layer comprising the fifth conductive barrier layer 307 and the fourth conductor 308 was formed, it was observed such failure that the second etching stopper layer and protection insulative layer 211 formed of silicon oxide just below the second copper wiring layer was dissipated to make the heights of the wiring nonuniform. On the contrary, such failure was not observed for the specimens using materials other than silicon oxide as the first and second etching stopper layer and protection insulation films, and also in a case where the second opening 401 has an opening in a region other than the copper wiring layer, the first etching stopper layer and protection insulative film 210 just below the opening was left substantially as it was.

To examine the reason why the variations in the wiring resistance is small and the conduction yield of the via hole is high in the specimen using silicon oxide as the first and second etching stopper layer and protection insulation films, the etching rates when the respective materials (silicon oxide, silicon carbide, silicon nitride, organic group-containing silicon oxide and aluminum oxide) were etched under the dry etching condition for P-MSO as the third insulative diffusion barrier layer ($C_4F_8$ gas used) were compared with one another. As a result, it was found that while the etching rate of silicon oxide was substantially equal to that of P-MSO, the etching rate of other materials was low, that is, about ½ to 1/20 that of the P-MSO film.

Then, when the leak current between adjacent copper wiring in the first copper wiring layer and the dielectric breakdown life were evaluated, it provided a result that in any of the specimens the dielectric breakdown lifetime of 100 years or more was obtained at the portion between adjacent copper wiring under the electric field intensity of 2 MV/cm, but the leak current between adjacent copper wiring was increased somewhat in a case of using silicon carbide. Further, when the parasitic capacitance of the first copper wiring layer was measured, it provided a result that the parasitic capacitance was somewhat increased in a case of using silicon nitride and aluminum oxide. In a case of using organic-containing silicon, although the leak current or parasitic capacitance did not increase, it was observed that a film was peeled occasionally from part of a wafer during the steps of fabricating a semiconductor device.

As described above, while the variations in the wiring resistance and the conduction yield are improved by the use of materials other than silicon oxide whose dry etching rate is lower than the P-MSO film, the materials have their respective features regarding other performances. Therefore, it is desirable that they be used selectively depending on the application use of the semiconductor device and the feature of the production process.

That is, in accordance with the example of this invention, it is possible to form a semiconductor device having copper wiring with less variations in wiring resistance and a high conduction yield of a via hole in a structure where P-MSO is formed as the insulative diffusion barrier layer just above the copper wiring, by covering the region just below the insulative diffusion barrier layer where copper wiring are not formed with an insulative film having a dry etching rate of ½ or less of that of P-MSO.

While the study has been made in this example on the case of silicon carbide, silicon nitride, organic group-containing silicon oxide and aluminum oxide as the etching stopper layer and protection insulative film of P-MSO as the insulative diffusion barrier layer formed just above the copper wiring, the effect of the invention is not restricted only to the combination described above. Similar effects can be expected so long as the insulative film material has a dry etching rate of ½ or less of that of P-MSO when the dry etching conditions of P-MSO are applied thereto. It will be apparent in this case that the specific dielectric constant and the leak current of the insulative film are as low as possible.

Further, in this example, while the thickness of the etching stopper layer and protection insulative film was 25 nm, the thickness may be changed with the view point of the performance of the semiconductor and the process margin. Since the lowering of the reliability can be suppressed as the thickness of the etching stopper layer and protection insulative film is larger even when P-MSO as the insulative diffusion barrier layer is etched excessively, an improvement in product yields can be expected. However, since the specific dielectric constant of the etching stopper layer and protection insulative film is usually higher than that of the insulative film used therebelow, that is, SiLK with specific dielectric constant of 2.7 in this example, the parasitic capacitance for the entire wiring may possibly be increased to lower the performance. On the other hand, when the thickness of the etching stopper layer and protection insulative film is reduced, an increase in the parasitic capacitance can be minimized but, when P-MSO as the insulative diffusion barrier layer is etched excessively, the insulative film used therebelow, that is, SiLK in this example is exposed to possibly lower the reliability. Accordingly, the thickness of the etching stopper layer and protection insulative film is suitably from 15 nm to 150 nm and, more preferably, in a range from 25 nm to 100 nm.

Further, in this example, while P-MSO containing 3% nitrogen concentration was formed as the insulative diffusion barrier layer just above the copper wiring, the nitrogen concentration is not restrictive and P-MSO with optional nitrogen concentration capable of satisfying required reliability and performance as shown in Example 3 can be used. Further, so long as required reliability and performance can be satisfied, it can be prepared also by using other inorganic silane gases or organic silane gases instead of silane.

Further, in this example, while SiLK which is the organic low dielectric constant insulation film is used as the second, third and fifth insulation films, the effect of the invention is not developed only by the combination described above. Similar effects can be expected also for the combination with an organic film containing fluoro resin typically represented by Teflon (trade name of products manufactured by DuPont) or FLARE (trade name of products manufactured by Allied Signal, Inc.), a CVD insulation film using methyltriethoxysilane (($C_2H_5O)_3SiCH_3$) as the starting material gas, an organic containing silicon oxide film containing, for example, Black Diamond (trade name of products manufactured by Applied Materials Co.) or HSG-R7 (trade name of products manufactured by Hitachi Chemical Co., LTD.), a porous insulation film containing, for example, Nanoglass (trade name of products manufactured by Allied Signal, Inc.) or XLK (trade name of products manufactured by Allied Signal, Inc.), and an inorganic low dielectric silicon oxide film with addition of fluorine, as the low dielectric constant insulative film. While this invention is effective also on a case of using a usual silicon oxide film of not a low dielectric constant insulative film (specific dielectric constant of about 4) as the second, third, or fifth insulative film, it will be apparent that the combination with the low dielectric constant insulative film is most effective in reducing the parasitic capacitance.

Further, in this example, the sputtering method and the plating method were combined with each other as the copper deposition method, this is not restrictive but the film can be deposited also by a CVD method or the like.

Further, while the copper wiring layer is formed only with two layers in this example, it is possible to optionally stack the wiring layers successively.

EXAMPLE 5

Figure 15:
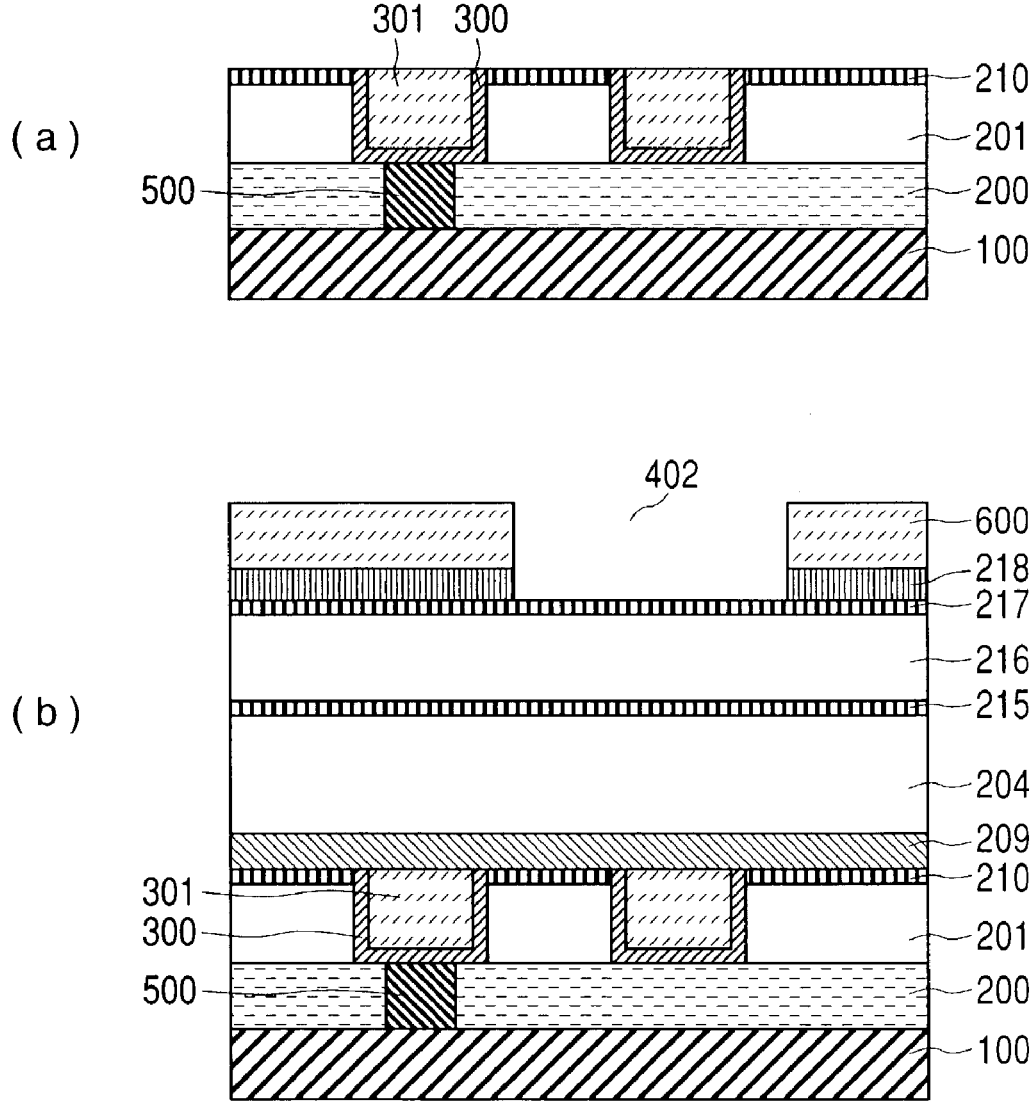
FIG. 15 is a schematic cross sectional view illustrating a main portion of the steps of manufacturing a semiconductor device according to Example 5 of this invention.

FIGS. 15 to 17 are cross sectional views illustrating the steps of manufacturing a semiconductor device having a dual damascene type copper wiring structure according to this invention. The steps is to be described successively. After forming a first insulative film 200 comprising silicon oxide of 400 nm in thickness on a substrate 100 in which semiconductor elements were formed, an opening was provided at a desired region in the first insulative film 200 for establishing electrical connection with the substrate 100, which was filled with a tungsten plug 500 by a CVD method. Then, after coating and baking SiLK (trade name of products manufactured by Dow Chemical Company) which is an organic low dielectric constant insulative film of 320 nm in thickness to form a second insulative film 201, a first etching stopper layer and protection insulative film 210 comprising silicon carbide as a main ingredients of 25 nm in thickness was formed by a plasma CVD method. Then, an opening was provided at a desired region of the second insulative film 201 and the first etching stopper layer and protection insulative film 210 by the combination of usual photolithographic method and dry etching method and, after forming a titanium nitride film of 30 nm in thickness by using a sputtering method and a copper film of 500 nm in thickness by the combination of a sputtering method and an electrolytic plating method successively so as to fill the opening, the titanium nitride film and the copper film on the first etching stopper layer and protection insulative film 210 were removed by the CMP method, and a first copper wiring layer comprising a first conductive barrier layer 300 of titanium nitride and a first conductor 301 of copper was formed so as to fill the opening 400 (FIG. 17(a)).

Then, as described in Example 3 a third insulative diffusion barrier layer 209 comprising P-MSO (nitrogen concentration: 3 atm %) of 50 nm in thickness, a third insulative film 204 comprising SiLK which is the organic low dielectric constant insulative film of 325 nm in thickness, a first intermediate stopper film 215 comprising silicon carbide as a main ingredient of 25 nm film thickness, a sixth insulative film 216 comprising SiLK which is the organic low dielectric constant insulative film of 325 nm in thickness, and a fourth etching stopper layer and protection insulative film 217 were formed successively by using a gas mixture containing silane and $N_2O$ as a starting material gas by a parallel plate type plasma CVD system on the copper wiring layer. Then, a first hard mask 218 comprising silicon oxide of 75 nm in thickness was formed, and a third opening 402 was made at a desired region of the first photoresist 600 and the first hard mask 218 by the combination of usual photolithographic method and dry etching method (FIG. 15(b)).

Then, after removing the first photoresist 600 by a resist asher, and applying a resist so as to cover the opening provided at the first hard mask 218 by using a photolithographic method again to perform exposure and development, thereby making an opening at a desired region of the second photoresist 601. Subsequently, a fourth opening 403 was provided at a desired region of the fourth etching stopper layer and protection insulative film 217 by using the second photoresist 601 as an etching mask and using a dry etching method (FIG. 16(a)).

Then, after removing the second photoresist 601 by a resist asher, an opening was provided at the sixth insulative film 216 by using the fourth etching stopper layer and protection insulative film 217 as an etching mask. Further, the etching gas was switched to a gas mixture of $CH_4$ and oxygen to perform dry etching, and openings were made at fourth etching stopper layer and protection insulation film 217 by using the first hard mark 218 as the etching mask and to the first intermediate stopper films 215 by using the sixth insulative film 216 as the etching mask (FIG. 16(b)), Then, the etching gas was switched again to ammonia and etching was conducted for a period of time corresponding to about 420 nm being converted into the etched thickness of the SiLK film to make an opening in the sixth insulative film 216 and the third insulative film 204. In this case, since the first hard mask 218, the fourth etching stopper layer and protection insulative film 217, the first intermediate stopper film 215 and the third insulative diffusion barrier layer 209 were scarcely etched with the ammonia gas, a structure shown in FIG. 17(a) was obtained.

Then, to remove the third insulative diffusion barrier layer 209, after dry etching by 75 nm being converted into the thickness of P-MSO using $C_4F_8$ series gas, cleaning was performed and a second copper wiring layer having a via hole comprising a sixth conductive barrier layer 309 of titanium nitride of 30 nm in thickness and a fifth conductor 310 of copper was formed by a combination of a sputtering method, an electrolytic method and a CMP method, on which a fifth insulative diffusion barrier layer 219 comprising P-MSO of 50 nm in thickness, a seventh insulative film 220 comprising SiLK of 325 nm in thickness and a fourth protection insulative film 221 comprising silicon oxide of 25 nm in thickness were further formed to constitute a semiconductor device (FIG. 17(b)).

In the structure shown in Example 5, while a plasma CVD film comprising silicon carbide as a main ingredient of 25 nm in thickness was used as the first intermediate stopper film 215, several kinds of specimens prepared by using silicon oxide, silicon nitride, organic group-containing silicon oxide and aluminum oxide respectively were prepared additionally.

When the performance and the reliability of the thus formed semiconductor devices were examined, it provided a result that the variations of electric resistance in the second copper wiring layer and the connection hole were increased in the specimen using silicon oxide as the first intermediate stopper film compared with a case of using other materials. When the cross section of the second copper wiring layer and the interlayer via hole were observed under the SEM to examine the reason, it was often observed for the specimen using silicon oxide that the first intermediate stopper film 215 which should be present just below the second copper wiring layer was dissipated to make the heights of the wiring nonuniform or the shape of the connection hole undesirable. On the contrary, such failure was not observed for the specimens using materials other than silicon oxide as the first intermediate stopper film. When the reason was examined further specifically, it has been found that when the dry etching was performed to make the opening in the third insulative diffusion barrier layer 209 comprising P-MSO, the first intermediate film 215 is also etched simultaneously to expose the third insulative film comprising SiLK or engrave the film in a case of using silicon oxide as the first intermediate stopper film. On the other hand, in a case of using silicon carbide, silicon nitride, organic group-containing silicon oxide or aluminum oxide as the first intermediate stopper layer, since the dry etching rate is lower compared with P-MSO as described also in Example 5, the first intermediate stopper film 215 was not dissipated even when the opening was made in the third insulative diffusion barrier layer 209.

Then, when the leak current between the adjacent copper wiring in the second copper wiring layer and the dielectric breakdown lifetime were evaluated, it provided a result for any of the specimens that the dielectric breakdown lifetime for a portion between adjacent copper wiring was 100 year or more under the electric field intensity of 2 MV/cm, but the leak current between the adjacent copper wiring increased somewhat in a case of using silicon carbide as the first intermediate stopper film. Further, when the parasitic capacitance of the second copper wiring layer was measured, it provided a result that the parasitic capacitance increased somewhat in a case of using silicon nitride and aluminum oxide. In a case of using organic-containing silicon, while the leak current or parasitic capacitance did not increase, it was observed that films were peeled occasionally from some wafers during the steps of manufacturing semiconductor devices.

As has been described above, in the step of manufacturing the semiconductor devices having the dual damascene type copper wiring structure as described in this example, the variations of the wiring resistance and the via hole resistance can be improved by using the materials other than silicon oxide with a lower dry etching rate compared with the P-MSO film as the first intermediate stopper. However, since the materials has their respective features regarding other performances, it is desirable to selectively use them depending on the application uses of the semiconductor device and the features of the production process.

That is, in accordance with the example of the invention, it is possible to form a semiconductor device having copper wiring with less variations of the wiring resistance and high reliability in a case of forming P-MSO as the insulative diffusion barrier layer just above the first copper wiring and forming a dual damascene type copper wiring having a via hole to the first copper wiring, by using an insulative film having a dry etching rate of ½ or less of that of P-MSO for the material forming the first intermediate stopper as a fabrication mask for the via hole.

In this example, while the first intermediate stopper film has been studied taking silicon carbide, silicon nitride, organic group-containing silicon oxide and aluminum oxide as examples, the effects of the invention are not restricted only to the combinations described above. Similar effects can be expected providing that the insulative film material has a dry etching rate ½ or less of that of P-MSO under the application of the dry etching condition for P-MSO. In this case, it will be apparent that the specific dielectric constant and the leak current of the insulative film are desirable as low as possible.

Further, in this invention, while the thickness of the first intermediate stopper film was 25 nm, it is possible to change the thickness with a view point of the semiconductor performance and the process margin. Since the lowering of the reliability can be suppressed as the thickness of the first intermediate stopper is larger even when the P-MSO as the insulative diffusion barrier layer is etched excessively, an improvement in the productive yield can be expected. However, since the specific dielectric constant of the first intermediate stopper layer is generally higher than the specific dielectric constant of the insulative film used therebelow, that is, SiLK of specific dielectric constant of 2.7 in this example, it is possible that the parasitic capacitance of the entire wiring may increase to lower the performance. On the other hand, while an increase in the parasitic capacitance can be minimized when the thickness of the first intermediate stopper film is reduced, when P-MSO as the insulative diffusion barrier layer is etched excessively, the insulative film used therebelow, that is, SiLK in this example is exposed to possibly lower the reliability. Accordingly, the thickness of the first intermediate stopper film is appropriately from 15 nm to 150 nm and, more preferably, in a range from 25 nm to 100 nm.

Further, in this example, P-MSO containing 3 atm % of nitrogen concentration was formed as the insulative diffusion barrier layer just above the copper wiring, the nitrogen concentration is not restrictive but P-MSO with any nitrogen concentration capable of satisfying required reliability and performance as shown in Example 3 can be used. Further, so long as the required reliability and performance are satisfied, it is also possible to use films prepared by gases using other inorganic silane or organic silane gases instead of silane.

Further, in this example, while SiLK which is the organic low dielectric insulative film is used as the second, third, sixth and seventh insulative films, the effects of invention are not provided only with the combination described above. Similar effects can also be expected also by the combination with an organic film containing fluoro resin typically represented by Teflon (trade name of products manufactured by DuPont) or FLARE (trade name of products manufactured by Allied Signal, Inc.), a CVD insulation film using methyltriethoxysilane ($(C_2H_5O)_3SiCH_3$) as the starting material gas, an organic containing silicon oxide film containing, for example, Black Diamond (trade name of products manufactured by Applied Materials Co.) or HSG-R7 (trade name of products manufactured by Hitachi Chemical, Co., Ltd.), a porous insulation film containing, for example, Nanoglass (trade name of products manufactured by Allied Signal Inc.) or XLK (trade name of products manufactured by Allied Signal Inc), and an inorganic low dielectric silicon oxide film with addition of fluorine, as the low dielectric constant insulative film. While this invention is effective also on a case of using a usual silicon oxide film of not a low dielectric constant insulative film (specific dielectric constant of about 4) as the second, third, third, sixth or seventh insulative film, it will be apparent that the combination with the low dielectric constant insulative film is most effective in reducing the parasitic capacitance.

Further, in this example, the sputtering method and the plating method were combined as the copper deposition method, this is not restrictive but the film can be deposited also by a CVD method or the like.

Further, in this example, while the copper wiring layer is formed only with two layers, it is possible to optionally stack the wiring layers successively.

This invention can provide a semiconductor device having copper wiring of high performance and high reliability, as well as a manufacturing method therefor.

The invention claimed is:

1. A semiconductor device comprising:
  a substrate in which semiconductor elements are formed;
  metal wiring for interconnecting the semiconductor elements; and
  an insulative diffusion barrier layer directly covering at least a portion of the metal wiring,
  wherein at least a portion of the surface on the periphery of the metal wiring has a region made of a material comprising copper as a main ingredient,
  a portion of the region made of the material comprising copper as the main ingredient is in contact with the insulative diffusion barrier layer,
  the insulative diffusion barrier layer is formed to have a dielectric being 5 or less, a leak current at a test temperature of 140° C., under an electric field strength of 2 MV/cm being 10 nA or less per 1 cm$^2$, and a dielectric breakdown lifetime when copper is used as an anode at a temperature of 140° C. being at least 100 years, and
  the insulative diffusion barrier layer has oxygen, silicon and nitrogen as main constituent elements, a concentration of the nitrogen being from 0.5 to 12.5 atm %.

2. A semiconductor device as defined in claim 1, wherein a region just below the insulative diffusion barrier layer comprises the metal wiring and an insulative etching stopper layer, a portion of the metal wiring in contact with the insulative diffusion barrier layer has a region made of a material comprising copper as a main ingredient, and a dry etching rate of the insulative etching stopper layer is one-half or less of that of the insulative diffusion barrier layer.

3. A semiconductor device as defined in claim 2, wherein the insulative etching stopper layer comprises an insulative layer selected from silicon carbide, silicon nitride, organic group-containing silicon oxide and aluminum oxide as a main ingredient.

* * * * *